United States Patent
Song et al.

(10) Patent No.: US 11,891,686 B2
(45) Date of Patent: Feb. 6, 2024

(54) APPARATUS AND METHODS FOR DEPOSITING VARIABLE INTERFERENCE FILTERS

(71) Applicant: UNIVERSITY OF THE WEST OF SCOTLAND, Paisley (GB)

(72) Inventors: Shigeng Song, Paisley (GB); Desmond Gibson, Helensburgh (GB); David Hutson, Milnathort (GB)

(*) Notice: Subject to any disclaimer, the term of this patent is extended or adjusted under 35 U.S.C. 154(b) by 909 days.

(21) Appl. No.: 16/485,862

(22) PCT Filed: Feb. 13, 2018

(86) PCT No.: PCT/GB2018/050392
§ 371 (c)(1),
(2) Date: Aug. 14, 2019

(87) PCT Pub. No.: WO2018/150173
PCT Pub. Date: Aug. 23, 2018

(65) Prior Publication Data
US 2019/0390324 A1    Dec. 26, 2019

(30) Foreign Application Priority Data

Feb. 15, 2017 (GB) ..................................... 1702478

(51) Int. Cl.
*C23C 14/35* (2006.01)
*C03C 17/34* (2006.01)
(Continued)

(52) U.S. Cl.
CPC .......... *C23C 14/35* (2013.01); *C03C 17/3417* (2013.01); *C23C 14/044* (2013.01);
(Continued)

(58) Field of Classification Search
CPC . C23C 14/0028; C23C 14/044; C23C 14/083; C23C 14/10; C23C 14/35;
(Continued)

(56) References Cited

U.S. PATENT DOCUMENTS 4,227,948 A    10/1980  Jensen et al.
4,303,489 A *  12/1981  Morrison, Jr. ........ C23C 14/044
                                                    204/192.15

(Continued)

FOREIGN PATENT DOCUMENTS

CN    1304857 C     3/2007
CN    101182132 A   5/2008
(Continued)

OTHER PUBLICATIONS

Machine Translation JP 2010-049137 (Year: 2010).*
(Continued)

*Primary Examiner* — Rodney G McDonald
(74) *Attorney, Agent, or Firm* — SNELL & WILMER L.L.P.

(57) ABSTRACT

Apparatus for depositing one or more variable interference filters onto one or more substrates comprises a vacuum chamber, at least one magnetron sputtering device and at least one movable mount for supporting the one or more substrates within the vacuum chamber. The at least one magnetron sputtering device is configured to sputter material from a sputtering target towards in the mount, thereby defining a sputtering zone within the vacuum chamber. At least one static sputtering mask is located between the sputtering target and the mount. The at least one static sputtering mask is configured such that, when each substrate is moved through the sputtering zone on the at least one movable mount, a layer of material having a non-uniform thickness is deposited on each said substrate.

20 Claims, 9 Drawing Sheets

(51) Int. Cl.
- *C23C 14/04* (2006.01)
- *G02B 5/28* (2006.01)
- *H01J 37/34* (2006.01)
- *C23C 14/54* (2006.01)

(52) U.S. Cl.
CPC ............ *C23C 14/54* (2013.01); *C23C 14/542* (2013.01); *C23C 14/545* (2013.01); *C23C 14/546* (2013.01); *G02B 5/285* (2013.01); *H01J 37/347* (2013.01); *H01J 37/3408* (2013.01); *H01J 37/3476* (2013.01); *C03C 2218/156* (2013.01); *C03C 2218/322* (2013.01); *C03C 2218/34* (2013.01)

(58) Field of Classification Search
CPC ... C23C 14/352; C23C 14/542; C23C 14/568; C23C 14/5833; C23C 14/54; C23C 14/545; C23C 14/546; C23C 14/547; C03C 17/3417; C03C 2218/154; C03C 2218/156; C03C 2218/322; C03C 2218/34; G02B 5/285; H01J 37/3405; H01J 37/3408; H01J 37/347; H01J 37/3476
USPC ........................... 204/298.11, 298.03, 192.13
See application file for complete search history.

(56) References Cited

U.S. PATENT DOCUMENTS

| | | | | |
|---|---|---|---|---|
| 4,415,427 A | * | 11/1983 | Hidler | C23C 14/352 204/192.15 |
| 4,704,339 A | | 11/1987 | Green et al. | |
| 4,735,699 A | | 4/1988 | Wort et al. | |
| 4,740,442 A | | 4/1988 | Waddell et al. | |
| 4,775,347 A | * | 10/1988 | Takada | G01J 5/08 228/198 |
| 4,851,095 A | * | 7/1989 | Scobey | C23C 14/0078 204/192.15 |
| 4,870,027 A | | 9/1989 | Chu et al. | |
| 5,015,493 A | * | 5/1991 | Gruen | C23C 14/32 427/571 |
| 5,618,388 A | * | 4/1997 | Seeser | C23C 14/083 204/192.12 |
| 5,872,655 A | | 2/1999 | Seddon et al. | |
| 6,475,557 B1 | | 11/2002 | Mori et al. | |
| 2002/0131044 A1 | | 9/2002 | Kobayashi et al. | |
| 2002/0191175 A1 | | 12/2002 | Coombs et al. | |
| 2003/0038938 A1 | | 2/2003 | Jung et al. | |
| 2003/0076499 A1 | | 4/2003 | Yamada et al. | |
| 2003/0203108 A1 | | 10/2003 | Chang et al. | |
| 2004/0043218 A1 | | 3/2004 | Johnson et al. | |
| 2004/0162470 A1 | | 8/2004 | Tu | |
| 2005/0129577 A1 | | 6/2005 | Potapov et al. | |
| 2006/0216470 A1 | | 9/2006 | Johnson et al. | |
| 2006/0249815 A1 | | 11/2006 | Forbes et al. | |
| 2007/0148760 A1 | | 6/2007 | Kiesel et al. | |
| 2007/0275563 A1 | | 11/2007 | Babich et al. | |
| 2008/0187011 A1 | | 8/2008 | Kiesel et al. | |
| 2008/0224046 A1 | | 9/2008 | Ogando et al. | |
| 2008/0278724 A1 | | 11/2008 | Wu et al. | |
| 2009/0017230 A1 | | 1/2009 | Tudhope et al. | |
| 2009/0242771 A1 | | 10/2009 | Hartley | |
| 2010/0043706 A1 | | 2/2010 | Jung et al. | |
| 2010/0092083 A1 | | 4/2010 | Herloski et al. | |
| 2010/0148083 A1 | | 6/2010 | Brown et al. | |
| 2011/0089316 A1 | | 4/2011 | Hosier et al. | |
| 2015/0109663 A1 | | 4/2015 | Gittler et al. | |
| 2015/0240348 A1 | * | 8/2015 | Hanihara | G02B 5/285 204/192.26 |
| 2016/0237547 A1 | | 8/2016 | Sprague | |
| 2016/0254127 A1 | | 9/2016 | Vergöhl et al. | |

FOREIGN PATENT DOCUMENTS

| | | | |
|---|---|---|---|
| CN | 101414017 | A | 4/2009 |
| CN | 101464530 | A | 6/2009 |
| CN | 104480436 | A | 4/2015 |
| CN | 104597550 | A | 5/2015 |
| DE | 102007057753 | A1 | 6/2009 |
| JP | 2006139102 | A | 6/2006 |
| JP | 2007-247028 | * | 9/2007 |
| JP | 2010-049137 | * | 4/2010 |
| RU | 2357321 | C1 | 5/2009 |
| WO | 9700458 | A1 | 1/1997 |
| WO | 0169213 | A3 | 9/2001 |
| WO | 02082990 | A1 | 10/2002 |
| WO | 2004029324 | A1 | 4/2004 |
| WO | 2004106889 | A3 | 12/2004 |
| WO | 2006032925 | A1 | 3/2006 |

OTHER PUBLICATIONS

Machine Translation JP 2007-247028 (Year: 2007).*
Li, Cheng et al. (2017). Modeling and validation of uniform large-area optical coating deposition on a rotating drum using microwave plasma reactive sputtering.
Shigeng Song et al. "Reactive dynamics analysis of critical Nb2O5 sputtering rate for drum-based metal-like deposition," Appl. Opt. 56, C206-C210 (2017).
Gamarts, AE et al. (2006). Photoluminescence in the Pb1-xCdxSe Polycrystalline Layers Activated in the Presence of Iodine Vapor. Semiconductors.

* cited by examiner

APPARATUS AND METHODS FOR DEPOSITING VARIABLE INTERFERENCE FILTERS

FIELD OF THE INVENTION

The invention relates to apparatus and methods for depositing one or more variable interference filters onto one or more substrates.

BACKGROUND TO THE INVENTION

Interference filters typically selectively transmit or reflect incident light in one or more spectral bands, the characteristic wavelengths of the bands being determined by Fabry-Pérot interference between rays of light partially reflected and partially transmitted at two or more interfaces within the said interference filter. Interference filters typically have multi-layered structures comprising layers of different dielectric materials forming the partially reflecting and transmitting interfaces therebetween. The spectral characteristics of a given interference filter are determined by the optical properties (and in particular the refractive index), as well as the thickness of, and spacing between, each said layer.

A variable interference filter is an interference filter whose spectral properties (i.e. the wavelength dependence of the filter's transmittance and/or reflectance) vary along at least one dimension of the said filter. This spatial variation in spectral properties may be achieved by varying the thickness of one or more of the layers across the said at least one dimension of the filter. A linear variable filter (LVF) is a variable interference filter whose spectral properties vary linearly across the said at least one dimension.

Linear variable filters have found uses in multispectral and hyperspectral imaging or sensing applications, such as remote imaging and sensing in environmental, agricultural and climate monitoring, as well as medical and intelligent lighting applications. LVFs may be used in spectrometers (such as ultraviolet (UV) or infrared (IR) spectrometers) with applications in atmospheric gas sensing, pharmaceutical analysis and biomolecular identification. LVFs have also found application in biomedical imaging for non-destructive and non-invasive analysis combining micro-spectroscopy and microscopic imaging in hyper-spectral imaging systems.

High-performance LVFs having both a high resolution and high transmittance can be produced by varying the thickness of all layers forming the filters, thereby forming wedge-shaped filters. Such LVFs are, however, difficult to manufacture, as this requires precise control of thin film deposition processes, both in terms of the location of deposited material and the thickness of the layers formed. Indeed, deposited layers may be only one or two atoms thick, depending on the desired spectral properties.

Variable interference filters, such as LVFs, are currently produced commercially using low-throughput techniques having a complex setup. For example, electron beam deposition and dual ion beam sputter deposition have been used to produce LVFs. However, such methods are expensive and require extensive heating-up and cooling-down periods which increase filter costs and reduce throughput. Both method also make use of dynamic uniformity masking which is difficult to control, which again reduces throughput and which also results in imprecise spatial grading. Ion beam sputtering techniques in particular also suffer from intrinsically low deposition rates. Accordingly, there is a need for new methods of depositing variable interference filters having higher throughputs while retaining precise layer thickness control. In particular, there is a need for methods of depositing variable interference filters at room temperature.

SUMMARY OF THE INVENTION

A first aspect of the invention provides apparatus for depositing one or more variable interference filters onto one or more substrates. The apparatus comprises a vacuum chamber, at least one magnetron sputtering device and at least one movable mount for supporting the one or more substrates within the vacuum chamber. The at least one magnetron sputtering device is configured to sputter (i.e. in use) material from a sputtering target towards the mount, thereby defining a sputtering zone within the vacuum chamber. At least one static sputtering mask is located between the sputtering target and the mount, the at least one static sputtering mask being configured (e.g. shaped) such that (i.e. in use), when each substrate is moved through the sputtering zone on the at least one movable mount, a layer of (i.e. sputtered) material having a non-uniform thickness is deposited on each said substrate.

An interference filter is a filter which selectively transmits (i.e. and/or reflects) incident light in one or more characteristic wavelength ranges (i.e. spectral bands). The transmission and/or reflection wavelength ranges are determined by Fabry-Pérot interference between rays of light partially reflected and partially transmitted at two or more interfaces of (e.g. within) the interference filter. An interference filter typically has a multi-layered structure comprising a plurality of interfaces at which light may be partially reflected and partially transmitted. The transmission and/or reflection wavelength ranges are typically determined by the optical properties (e.g. refractive index) of each layer forming the interference filter and the thickness of each said layer.

A variable interference filter is an interference filter whose spectral properties (i.e. wavelength dependence of the filter's transmittance and/or reflectance) vary along at least one dimension of the said filter.

It will be understood that, throughout this specification and the appended claims, "light" is used to refer to electromagnetic radiation in general and is not restricted to radiation in the visible spectrum.

The thickness of the layer of material deposited onto each substrate is typically measured in a direction (e.g. substantially) perpendicular to a surface of the said substrate. The surface of each substrate onto which the material is deposited is typically a surface of the substrate which faces the sputtering target when the said one or more substrates are provided in the sputtering zone.

The skilled person will understand that the layer of material having a non-uniform thickness means that the thickness of the layer of material varies spatially (i.e. with location) across the said layer. Because the thickness of the layer of material which is deposited is non-uniform, the optical (i.e. spectral) properties of the said layer are also typically non-uniform.

It may be that the layer of material has a non-uniform thickness along at least one direction (i.e. in the said layer). It may be that each substrate is moved linearly (i.e. along a (e.g. substantially) straight line) through the sputtering zone on the at least one movable mount. The at least one direction along which the layer of material is non-uniform is typically perpendicular to the (i.e. linear) direction of motion of each substrate through the sputtering zone.

The layer of material deposited on each substrate typically comprises a few monolayers of material, wherein a monolayer of material is one atom (or molecule) thick. For example, the layer of material deposited on each substrate typically comprises fewer than 30 monolayers of material, or more typically fewer than 20 monolayers of material, or more typically fewer than 10 monolayers of material. The number of monolayers of material deposited on each substrate typically varies (i.e. with location) across the surface of the substrate.

The at least one static sputtering mask is typically configured (e.g. shaped) to restrict (e.g. block or prevent) some of the material sputtered from the sputtering target from reaching the one or more substrates, such that the layer of material having a non-uniform thickness is deposited on each said substrate moved through the sputtering zone.

The at least one static sputtering mask may comprise a mask body configured (e.g. shaped) to restrict (e.g. block or prevent) some of the material sputtered from the sputtering target from reaching the one or more substrates. The at least one static sputtering mask body may be configured (e.g. shaped) such that the layer of material deposited on each of the one or more substrates has a non-uniform thickness (i.e. a thickness which varies spatially across the said layer).

One or more apertures may extend through the at least one static sputtering mask (e.g. the at least one static sputtering mask body). The one or more apertures extending through the at least one static sputtering mask (e.g. the at least one static sputtering mask body) may be configured (e.g. shaped) such that the layer of material deposited on each substrate has a non-uniform thickness (i.e. a thickness which varies spatially across the said layer). The one or more apertures are typically configured such that (i.e. some of the) material sputtered from the sputtering target (i.e. in use) passes through the said one or more apertures and is not restricted (e.g. blocked or prevented) from reaching the one or more substrates by the at least one static sputtering mask (e.g. the at least one static sputtering mask body). The at least one static sputtering mask (e.g. the at least one static sputtering mask body) may comprise a wire grille comprising a plurality of apertures.

The one or more apertures may be symmetric (e.g. have reflection symmetry). The one or more apertures may be symmetrically arranged. The at least one static sputtering mask may comprise two symmetrically arranged apertures.

The at least one static sputtering mask (e.g. the at least one static sputtering mask body and/or the one or more apertures) are typically configured to direct a non-uniform wavefront of material (i.e. sputtered from the sputtering target) towards the mount.

It may be that the at least one static sputtering mask (i.e. the at least one static sputtering mask body and/or the one or more apertures) is configured (e.g. shaped) such that the layer of material deposited on each substrate varies in thickness along a first direction (i.e. in the plane of the layer). It may be that the at least one static sputtering mask (i.e. the at least one static sputtering mask body and/or the one or more apertures) is configured (e.g. shaped) such that the layer of material deposited on each substrate varies continuously in thickness along the first direction (i.e. in the plane of the layer). It may be that the at least one static sputtering mask (i.e. the at least one static sputtering mask body and/or the one or more apertures) is configured (e.g. shaped) such that the layer of material deposited on each substrate varies monotonically in thickness along the first direction (i.e. in the plane of the layer). It may be that the at least one static sputtering mask (i.e. the at least one static sputtering mask body and/or the one or more apertures) is configured (e.g. shaped) such that the layer of material deposited on each substrate varies linearly in thickness along the first direction (i.e. in the plane of the layer). It may be that the at least one static sputtering mask (i.e. the at least one static sputtering mask body and/or the one or more apertures) is configured (e.g. shaped) such that the layer of material deposited on each substrate varies (e.g. linearly, continuously and/or monotonically) in thickness along the first direction (i.e. in the plane of the layer) in two or more regions and such that the layer of material is (i.e. substantially) uniform (i.e. constant) in thickness along the first direction in one or more regions between the said two or more regions.

It may be that the at least one static sputtering mask (i.e. the at least one static sputtering mask body and/or the one or more apertures) is configured (e.g. shaped) such that the layer of material deposited on each substrate is (e.g. substantially) uniform (i.e. constant) in thickness along a second direction (i.e. in the plane of the layer). The second direction may be perpendicular to the first direction. The thickness typically varies by less than 1.5%, or more typically less than 1%, or even more typically less than 0.5% along the second direction.

It may be that the at least one magnetron sputtering device, the at least one sputtering target, the at least one static sputtering mask (i.e. the at least one static sputtering mask body and/or the one or more apertures) and the at least one mount are configured (e.g. arranged, for example located and oriented) such that the layer of material deposited on each substrate varies (e.g. continuously, monotonically and/or linearly) in thickness along the first direction and is (e.g. substantially) uniform (i.e. constant) in thickness along the second direction.

It may be that the at least one static sputtering mask (i.e. the at least one static sputtering mask body and/or the one or more apertures) is configured (e.g. shaped) such that a wedge-shaped layer of material is deposited on each substrate.

The one or more apertures may be (e.g. substantially) elongate. The one or more apertures may be three-sided. The one or more apertures may be (e.g. substantially) triangular. The one or more apertures may be substantially wedge-shaped (i.e. cuneiform). The one or more apertures may be (e.g. substantially) tapered. The one or more apertures may extend (e.g. taper) along a direction (e.g. substantially) parallel to the first direction (i.e. along which the thickness of the layer of material varies). The one or more apertures may extend (e.g. taper) along a direction (e.g. substantially) perpendicular to a direction of travel of the said one or more substrates through the sputtering zone.

The one or more apertures may each comprise two or more (e.g. substantially) elongate aperture portions. The one or more apertures may each comprise two or more three-sided aperture portions. The one or more apertures may each comprise two or more (e.g. substantially) triangular aperture portions. The one or more apertures may each comprise two or more (e.g. substantially) wedge-shaped (i.e. cuneiform) aperture portions. The one or more apertures may each comprise two or more (e.g. substantially) tapered aperture portions. The two or more aperture portions may extend (e.g. taper) along a direction (e.g. substantially) parallel to the first direction (i.e. along which the thickness of the layer of material varies). The two or more aperture portions may extend (e.g. taper) along a direction (e.g. substantially) perpendicular to a direction of travel of the said one or more substrates through the sputtering zone. The two or more aperture portions may be symmetrically arranged (e.g. have reflection symmetry).

It may be that the at least one static sputtering mask is adjustable. For example, it may be that the least one static sputtering mask is adjustable in shape. It may be that the at least one static sputtering mask body is adjustable in shape. It may be that the one or more apertures are adjustable in shape. The characteristics (e.g. thickness variation) of the layer of material deposited on each substrate may therefore be calibrated by adjusting the at least one static sputtering mask (e.g. the at least one static sputtering mask body and/or the one or more apertures).

The skilled person will understand that by use of the term "static" in "at least one static sputtering mask" it is meant that the at least one sputtering mask is fixed in position. For example, the at least one static sputtering mask is typically fixed in position relative to the sputtering target. The at least one static sputtering mask may be fixedly mounted to the at least one magnetron sputtering device. The at least one static sputtering mask may form part of the at least one magnetron sputtering device. The at least one static sputtering mask is not typically (e.g. fixedly) mounted to the at least one mount or to the one or more substrates. The at least one static sputtering mask does not typically move when the at least one mount moves.

However, the at least one static sputtering mask is not necessarily permanently fixed in position (e.g. relative to the sputtering target). The position and/or the orientation of the at least one static sputtering mask may be adjustable. For example, the position and/or the orientation of the at least one static sputtering mask may be adjustable between two or more fixed positions and/or orientations.

The apparatus may be apparatus for depositing one or more linear variable interference filters. A linear variable interference filter is a variable interference filter whose spectral properties (i.e. wavelength dependence of the filter's transmittance and/or reflectance) vary linearly along one dimension of the said filter. The spectral properties of the linear variable interference filter may vary linearly along a length of the linear variable interference filter. The linear variable interference filter may be (e.g. substantially) elongate and the spectral properties may vary along the length of the said (e.g. substantially) elongate linear variable interference filter.

The apparatus may be apparatus for depositing one or more non-linear variable interference filters. A non-linear variable interference filter is a variable interference filter whose spectral properties (i.e. wavelength dependence of the filter's transmittance and/or reflectance) vary non-linearly along at least one dimension of the said filter. The spectral properties of the non-linear variable interference filter may vary continuously along the at least one dimension of the said filter. The spectral properties of the non-linear variable interference filter may vary monotonically along the at least one dimension of the said filter. A non-linear variable interference filter may be (e.g. substantially) elongate. The spectral properties of the non-linear variable interference filter may vary non-linearly (but e.g. continuously and/or monotonically) along a length of the (e.g. substantially) elongate non-linear variable interference filter.

The spectral properties of the at least one variable interference filter may be (i.e. substantially) constant along one or more (i.e. discrete) portions of the length of the said at least one variable interference filter. For example, it may be that the spectral properties are (i.e. substantially) constant along one or more (i.e. discrete) portions of the length of the said at least one variable interference filter and that the spectral properties vary (e.g. linearly, non-linearly, continuously, and/or monotonically) along one or more (i.e. intervening, discrete) portions of the length of the said at least one variable intereference filter between the portions along which the spectral properties are (i.e. substantially) constant. The at least one variable interference filter may be (e.g. substantially) elongate and the one or more (i.e. discrete) portions along which the spectral properties are (i.e. substantially) constant may extend along the length of the said (e.g. substantially) elongate variable interference filter.

The variable interference filter may be a variable high-pass interference filter. The variable interference filter may be a variable low-pass interference filter. The band-edges of the variable high-pass or low-pass interference filters typically vary (e.g. continuously, monotonically and/or linearly) along at least one dimension of the said filters.

The variable interference filter may be a variable band-pass interference filter. The central wavelength of the pass-band of the variable band-pass interference filter typically varies (e.g. continuously, monotonically and/or linearly) along at least one dimension of the said filter.

The variable interference filter may be a variable notch interference filter. The central wavelength of the stopband of the variable notch interference filter typically varies (e.g. continuously, monotonically and/or linearly) along at least one dimension of the said filter.

The one or more variable interference filters (e.g. the one or more linear or non-linear variable interference filters) may be one or more variable IR interference filters, that is to say one or more variable interference filters configured to selectively transmit and/or reflect light having one or more wavelengths within the IR spectrum (i.e. having wavelengths within the range 700 nm to 1,000,000 nm, or more typically within the range 2000 nm to 14000 nm).

The skilled person will understand that by a magnetron sputtering device we mean apparatus adapted for carrying out magnetron sputtering of a sputtering target. Sputtering involves the ejection of particles (e.g. atoms) from a solid sputtering target on bombardment of the said target by energetic particles such as gas ions. In a magnetron sputtering device, an electric field is applied between the target and the substrate onto which material is to be sputtered such that the target functions as a cathode. A plasma is ignited in an inert gas (such as argon) adjacent to the target. An array of magnets (e.g. typically permanent magnets) is arranged around the target to generate a magnetic field which confines the inert gas plasma close to the surface of the target. The electric field accelerates gas ions from the plasma into the surface of the target, resulting in the ejection of uncharged particles from the target, which are subsequently deposited onto the substrate.

At least a portion of the at least one magnetron sputtering device may be located within the vacuum chamber. For example, the sputtering target may be located within the vacuum chamber. Alternatively, at least a portion of the at least one magnetron sputtering device may be provided in fluid communication with the interior of the vacuum chamber such that material may be transported between the at least one magnetron sputtering device and the interior of the vacuum chamber (e.g. material may be sputtered from the sputtering target in the at least one magnetron sputtering device into the vacuum chamber).

The at least one magnetron sputtering device may be a planar magnetron sputtering device, that is to say the magnetron sputtering device may be configured to generate a (e.g. substantially) planar sputtering plasma adjacent to the sputtering target (i.e. the plasma may be (e.g. substantially) confined to one plane). The at least one magnetron sputtering device may be a rectangular (e.g. linear) magnetron sputtering device, that is to say the magnetron sputtering device may be configured to generate a (e.g. substantially) rectangular sputtering plasma adjacent to the sputtering target (i.e. the plasma may be confined in a plane to a (e.g. substantially) rectangular shape).

The at least one magnetron sputtering device may be a direct current (DC) magnetron sputtering device. In a DC magnetron sputtering device, the electric field is generated between the sputtering target and the one or more substrates using a DC power source. DC magnetron sputtering is most suitable for sputtering electrically conductive metal targets. Conventional DC magnetron sputtering is less suitable for sputtering dielectric targets where charge build-up on the target due to deposition of plasma ions can lead to excessive arcing in the plasma and poisoning of the target. Accordingly, the at least one magnetron sputtering device may be configured to sputter metal from a metal sputtering target.

Alternatively, the at least one magnetron sputtering device may be a radio frequency (RF) magnetron sputtering device. In an RF magnetron sputtering device, the electric field is generated between the sputtering target and the one or more substrates using a radio-frequency alternating current (AC) power source. RF magnetron sputtering is suitable for sputtering both metal targets and dielectric targets as plasma ion charges are not able to build up on the target due to the oscillating electric field.

It may be that the at least one magnetron sputtering device is a pulsed RF magnetron sputtering device, that is to say an RF magnetron sputtering device configured such that the electric field is repeatedly pulsed (i.e. switched on and off).

It may be that the at least one magnetron sputtering device is a pulsed DC magnetron sputtering device, that is to say a DC magnetron sputtering device configured such that the DC electric field is repeatedly pulsed. Pulsing of the DC electric field may comprise switching the electric field on and off. Pulsing of the DC electric field may comprise varying (e.g. switching) the magnitude of the electric field, for example between first and second magnitudes. Pulsing of the DC electric field may comprise varying (e.g. switching) the polarity of the electric field, for example between first and second polarities (i.e. bipolar switching). Pulsing of the DC electric field may occur at a frequency of between 10 kHz to 350 kHz. Pulsing of the DC electric field repeatedly removes inert gas ions from the surface of the target and consequently prevents charge from building up on the surface of the target. Target surface charge should be avoided as it can lead to localised rapid discharge events and resultant ejection of particles from the target leading to contamination of the one or more substrates. Pulsed DC magnetron sputtering is suitable for sputtering both metal and dielectric targets.

The electric field used to generate the plasma within the at least one sputtering device may be applied between the at least one sputtering target and the at least one static sputtering mask, that is to say the at least one static sputtering mask may function as an anode.

The apparatus typically comprises means for moving (e.g. an actuator configured to move) the at least one mount such that the one or more substrates supported by the said at least one mount are moved through the sputtering zone. For example, it may be that the apparatus comprises means for moving (e.g. an actuator configured to move) at least a portion of the at least one mount through the sputtering zone.

The means for moving (e.g. the actuator configured to move) the at least one mount may be configured such that the one or more substrates are moved through the sputtering zone in a direction (e.g. substantially) perpendicular to the first direction (i.e. the first direction along which the thickness of the deposited layer varies). The means for moving (e.g. the actuator configured to move) the at least one mount may be configured such that the one or more substrates are moved through the sputtering zone in a direction (e.g. substantially) parallel to the second direction (i.e. the second direction along which the thickness of the deposited layer is (e.g. substantially) uniform, e.g. constant). It may be that the direction of movement of the one or more substrates through the sputtering zone defines the said first and second directions.

The at least one mount may be rotatable. The apparatus may comprise means for rotating (e.g. an actuator configured to rotate) the at least one mount such that the one or more substrates supported by the said at least one mount are moved through the sputtering zone. For example, it may be that the apparatus comprises means for rotating (e.g. an actuator configured to rotate) the at least one mount such that at least a portion of the at least one mount moves through the sputtering zone.

The means for rotating (e.g. the actuator configured to rotate) the at least one mount may be configured such that the one or more substrates are moved through the sputtering zone in a direction substantially perpendicular to the first direction (in which the layer of material deposited on the one or more substrates varies in thickness). The means for rotating (e.g. the actuator configured to rotate) the at least one mount may be configured such that the one or more substrates are moved through the sputtering zone in a direction (e.g. substantially) perpendicular to the direction in which the one or more apertures extend (e.g. taper).

The at least one mount may be rotatable about an axis (e.g. substantially) parallel to the first direction (in which the layer of material deposited on the one or more substrates varies in thickness). The at least one mount may be rotatable about an axis (e.g. substantially) parallel to the direction in which the one or more apertures extend (e.g. taper). The at least one mount may be rotatable about a (e.g. substantially) horizontal axis. The at least one mount may be rotatable about an axle extending along the said (e.g. horizontal) axis.

The at least one mount may be a drum. The drum may be (e.g. substantially) prismatic (e.g. cylindrical). The drum may take the shape of a convex regular polygonal prism. The drum may be rotatable about a longitudinal axis thereof (e.g. an axle extending along said longitudinal axis). The drum may be rotatable about a (i.e. substantially) horizontal longitudinal axis thereof. Alternatively, the drum may be rotatable about a (i.e. substantially) vertical longitudinal axis thereof. The drum is typically configured to support the one or more substrates. For example, one or more externally facing walls of the drum may be configured to support the one or more substrates.

It may be that the drum is configured to support one substrate. It may be that one externally facing wall of the drum is configured to support the said one substrate.

It may be that the drum is configured to support two or more substrates. It may be that one externally facing wall of the drum is configured to support the said two or more substrates. Alternatively, it may be that two or more externally facing walls of the drum are configured to support the two or more substrates. It may be that each of the two or more externally facing walls of the drum is configured to support a single corresponding substrate of the one or more substrates.

The apparatus may comprise one or more baffles configured to confine sputtered material within the sputtering zone. The one or more baffles may be located adjacent to the at least one magnetron sputtering device. The one or more baffles may extend away from the at least one magnetron sputtering device into the vacuum chamber towards the mount. The one or more baffles may extend away from one or more interior walls of the vacuum chamber towards the mount. The one or more baffles may define external boundaries (e.g. walls) of the sputtering zone. The one or more baffles may restrict (e.g. prevent) sputtered material from escaping from the sputtering zone into the rest of the vacuum chamber. The one or more baffles may restrict (e.g. prevent) particles (e.g. atoms, ions, molecules or molecular fragments) from entering the sputtering zone from the rest of the vacuum chamber.

The apparatus may comprise two or more magnetron sputtering devices. Each said magnetron sputtering device may be configured to sputter material from a corresponding sputtering target towards the mount, thereby defining respective sputtering zones within the vacuum chamber. The means for moving (e.g. the actuator configured to move) the at least one mount, or the means for rotating (e.g. the actuator configured to rotate) the at least one mount, may be configured such that the one or more substrates are moved through each said sputtering zone. A corresponding static sputtering mask may be located between each sputtering target and the mount, each said static sputtering mask being configured (e.g. shaped) such that a layer of material having a non-uniform thickness is deposited on each of the one or more substrates moved through each sputtering zone.

For example, the apparatus may comprise first and second magnetron sputtering devices, the first magnetron sputtering device being configured to sputter material from a first sputtering target towards the mount, thereby defining a first sputtering zone within the vacuum chamber, and the second magnetron sputtering device being configured to sputter material from a second sputtering target towards the mount, thereby defining a second sputtering zone within the vacuum chamber. The means for moving (e.g. the actuator configured to move) the at least one mount, or the means for rotating (e.g. the actuator configured to rotate) the at least one mount, may be configured such that the one or more substrates are moved through both the first and second sputtering zones. A first static sputtering mask may be located between the first sputtering target and the mount, the first static sputtering mask being configured (e.g. shaped) such that, when each substrate is moved through the first sputtering zone, a layer of material having a non-uniform thickness is deposited on the said substrate. A second static sputtering mask may be located between the second sputtering target and the mount, the second static sputtering mask being configured (e.g. shaped) such that, when each substrate is moved through the second sputtering zone, a layer of material having a non-uniform thickness is deposited on the said substrate.

The at least one sputtering target (e.g. the first sputtering target and/or the second sputtering target) may comprise (e.g. consist of) metal. The at least one sputtering target (e.g. the first sputtering target and/or the second sputtering target) may comprise (e.g. consist of) one or more elemental metals. The at least one sputtering target (e.g. the first sputtering target and/or the second sputtering target) may comprise (e.g. consist of) one or more metal alloys. The at least one sputtering target (e.g. the first sputtering target and/or the second sputtering target) may comprise (e.g. consist of) one or more of the following metals: titanium, tantalum, niobium, aluminium, silver, gold, hafnium.

The at least one sputtering target (e.g. the first sputtering target and/or the second sputtering target) may comprise (e.g. consist of) non-metal or metalloid materials. The at least one sputtering target (e.g. the first sputtering target and/or the second sputtering target) may comprise (e.g. consist of) one or more elemental non-metals or metalloids. The at least one sputtering target (e.g. the first sputtering target and/or the second sputtering target) may comprise (e.g. consist of) one or more of the following: silicon, carbon, germanium, cadmium telluride (CdTe), lead telluride (PbTe).

The apparatus may comprise at least one ionic treatment device. The at least one ionic treatment device typically comprises a source of gas ions. The at least one ionic treatment device is typically configured to direct gas ions towards the mount, thereby defining a ionic treatment zone within the vacuum chamber. The means for moving (e.g. the actuator configured to move) the at least one mount, or the means for rotating (e.g. the actuator configured to rotate) the at least one mount, may be configured such that the one or more substrates are moved through the ionic treatment zone. It may be that movement of the one or more substrates through the ionic treatment zone results in a chemical change of one or more layers of material located on the said one or more substrates.

The at least one ionic treatment device may be at least one oxidation device, that is to say a device comprising a source of oxygen ions. The at least one oxidation device may be configured to direct oxygen ions towards the mount, thereby defining an oxidising treatment zone within the vacuum chamber. The means for moving (e.g. the actuator configured to move) the at least one mount, or the means for rotating (e.g. the actuator configured to rotate) the at least one mount, may be configured such that the one or more substrates are moved through the oxidising treatment zone. It may be that movement of the one or more substrates through the oxidising treatment zone results in oxidation of one or more layers of material located on the said one or more substrates.

The at least one ionic treatment device may be at least one plasma processing device. The at least one plasma processing device typically comprises a source of plasma. The source of plasma typically comprises a source of gas (i.e. a source of gas atoms and/or molecules) and means for igniting a plasma within the gas. The at least one plasma processing device may be a microwave plasma device, that is to say that the means for igniting the plasma may comprise a source of microwave radiation. The at least one plasma processing device is typically configured to direct gas ions generated by the plasma towards the mount, thereby defining a plasma treatment zone within the vacuum chamber. The means for moving (e.g. the actuator configured to move) the at least one mount, or the means for rotating (e.g. the actuator configured to rotate) the at least one mount, may be configured such that the one or more substrates are moved through the plasma treatment zone.

Gas ions may be deposited on one or more substrates moved through the plasma treatment zone. Gas ions may react with one or more substrates moved through the plasma treatment zone. Gas ions may react with one or more layers of material located on the one or more substrates moved through the plasma treatment zone.

It may be that the gas supplied by the plasma processing device comprises oxygen and that the plasma processing device directs oxygen ions towards the mount, thereby defining a plasma oxidation zone within the vacuum chamber. It may be that movement of the one or more substrates through the plasma oxidation zone results in oxidation of one or more layers of material located on the said one or more substrates.

The means for moving (e.g. the actuator configured to move) the at least one mount, or the means for rotating (e.g. the actuator configured to rotate) the at least one mount, may be configured such that the one or more substrates are moved sequentially through the sputtering zone and through the plasma treatment zone.

It may be that the sputtering target is metal, that the at least one magnetron sputtering device is configured to deposit a layer of sputtered metal having a non-uniform thickness onto each substrate moved through the sputtering zone, and that the at least one plasma processing device is configured to oxidise each said layer of sputtered metal on each substrate moved through the plasma treatment zone (e.g. the plasma oxidation zone). The apparatus may therefore be configured to deposit one or more layers of metal oxide (i.e. dielectric) material onto the one or more substrates.

In embodiments having two or more magnetron sputtering devices, it may be that one or more (e.g. each) of the said magnetron sputtering devices are configured to deposit different metals onto the one or more substrates moved through the corresponding sputtering zones. For example, in embodiments having first and second sputtering devices, it may be that the first magnetron sputtering device is configured to deposit a first layer of a first metal on each substrate moved through the first sputtering zone, and that the second magnetron sputtering device is configured to deposit a second layer of a second metal on each substrate (e.g. onto the first layer) moved through the second sputtering zone. It may be that the first and/or second layers of metal are oxidised on movement of each substrate through the plasma treatment zone (e.g. plasma oxidation zone). The means for moving (e.g. the actuator configured to move) the at least one mount, or the means for rotating (e.g. the actuator configured to rotate) the at least one mount, may be configured such that the one or more substrates are moved repeatedly through each of the sputtering zones (e.g. the first and second sputtering zones) and the plasma treatment zone (e.g. plasma oxidation zone), thereby depositing alternating layers of metal oxide on each substrate.

The one or more substrates may be one or more glass substrates. The one or more substrates may be one or more borosilicate glass substrates (e.g. formed from BK7 glass). The one or more substrates may be one or more zinc sulphide substrates. The one or more substrates may be one or more germanium substrates. The one or more substrates may be one or more chalcogenide substrates (e.g. formed from chalcogenide glass such as germanium-sulphide (Ge—S) glass).

The apparatus may comprise at least one deposition sensor.

The deposition sensor may be configured to measure a parameter indicative of the amount of material deposited onto a sensing surface of the said deposition sensor. Additionally or alternatively, the deposition sensor may be configured to measure a parameter indicative of the rate at which material is deposited onto the sensing surface of the said deposition sensor.

The deposition sensor may be configured to measure a parameter indicative of the amount of material which is deposited onto the one or more substrates. The deposition sensor may be configured to measure a parameter indicative of the rate at which material is deposited onto the one or more substrates.

The apparatus may comprise a controller configured to receive measurements of the said parameter (i.e. the parameter indicative of the amount of material deposited or the rate at which material is deposited onto the sensing surface and/or the parameter indicative of the amount of material deposited or the rate at which material is deposited onto the one or more substrates) from the deposition sensor. The controller may be configured to cause a change in the movement of the at least one movable mount responsive to the received measurements. The controller may be configured to cause a change in the speed of the movement of the at least one movable mount responsive to the received measurements. The controller may be configured to cause a change in the speed of rotation of the at least one movable mount responsive to the received measurements. The controller may be configured to cause a change in the intensity of sputtering at the least one (e.g. first and/or second) magnetron sputtering device responsive to the received measurements. The controller may be configured to cause a change in the amount of power supplied to the at least one (e.g. first and/or second) magnetron sputtering device responsive to the said received measurements. The controller may be configured to switch the at least one (e.g. first and/or second) magnetron sputtering device on or off responsive to the received measurements.

In embodiments of the apparatus having two or more magnetron sputtering devices, the apparatus may comprise a first deposition sensor and a second deposition sensor. The first deposition sensor may be configured to measure a first parameter indicative of the amount of a first material (e.g. first metal) deposited onto a sensing surface of the said first deposition sensor from the first magnetron sputtering device. The second deposition sensor may be configured to measure a second parameter indicative of the amount of the amount of a second material (e.g. second metal) deposited onto a sensing surface of the said second deposition sensor from the second magnetron sputtering device. The apparatus may comprise a controller configured to receive measurements of the first parameter from the first deposition sensor and measurements of the second parameter from the second deposition sensor. The controller may be configured to cause a change in the movement of the at least one movable mount (e.g. the speed of the movement of the at least one movable mount, for example the speed of rotation of the at least one movable mount) and/or the intensity of sputtering at the first and/or second magnetron sputtering devices (e.g. the amount of power supplied to the first and/or second magnetron sputtering devices) responsive to the said received measurements of the first parameter and/or the second parameter.

For example, in use, the first magnetron sputtering device may be used to deposit a first material onto the one or more substrates moved through the first sputtering zone and the second magnetron sputtering device may be switched off. As the one or more substrates are moved repeatedly through the first sputtering zone, a layer of first material may be deposited onto the said one or more substrates one or more monolayers at a time. First material may also be deposited onto the sensing surface of the first deposition sensor, but only when first material is deposited onto the one or more substrates. The first deposition sensor may measure a parameter indicative of the amount of first material deposited onto the sensing surface (and/or the rate of deposition of first material onto the sensing surface), the said parameter also being indicative of the amount of first material deposited onto the one or more substrates (and/or the rate of deposition of first material onto the one or more substrates). The controller may receive the parameter measured by the first deposition sensor and thereby calculate the thickness of the layer of first material which has been deposited onto the one or more substrates. When the calculated thickness reaches a predefined desired first material layer thickness, the controller may switch off the first magnetron sputtering device and switch on the second magnetron sputtering device. As the one or more substrates are moved repeatedly through the second sputtering zone, a layer of second material may be deposited onto the layer of first material already deposited on the one or more substrates. Second material may also be deposited onto the sensing surface of the second deposition sensor, but only when second material is deposited onto the one or more substrates. The second deposition sensor may measure a parameter indicative of the amount of second material deposited onto the sensing surface (and/or the rate of deposition of second material onto the sensing surface), the said parameter also being indicative of the amount of second material deposited onto the one or more substrates (and/or the rate of deposition of second material onto the one or more substrates). The controller may receive the parameter measured by the second deposition sensor and thereby calculate the thickness of the layer of second material which has been deposited onto the one or more substrates. When the calculated thickness reaches a predefined desired second material layer thickness, the controller may switch off the second magnetron sputtering device. The process may be repeated to build up alternating layers of first and second material on the one or more substrates with accurately controlled thicknesses.

The at least one deposition sensor (e.g. the first and/or second deposition sensors) may (e.g. each) comprise a microbalance (e.g. a quartz crystal microbalance). The microbalance (e.g. the quartz crystal microbalance) is typically configured to measure a parameter indicative of the resonant frequency of an acoustic resonator (e.g. a quartz crystal resonator). The resonant frequency of the acoustic resonator (e.g. the quartz crystal resonator) typically depends sensitively on the mass of the said acoustic resonator (e.g. the quartz crystal resonator). Accordingly, small changes in mass of the acoustic resonator (e.g. the quartz crystal resonator) due to deposition of material onto the said acoustic resonator (e.g. onto the quartz crystal resonator) which result in changes to the resonant frequency are typically measured by the microbalance. The time dependence of the resonant frequency measured by the microbalance is typically indicative of the rate of deposition of material onto the acoustic resonator (e.g. onto the quartz crystal resonator).

The at least one deposition sensor (e.g. the first and/or second deposition sensor) may be static. The at least one deposition sensor (e.g. the first and/or second deposition sensor) may be (e.g. fixedly) mounted within the vacuum chamber. The at least one deposition sensor (e.g. the first and/or second deposition sensor) may form part of the at least one (e.g. first and/or second) magnetron sputtering device.

The at least one deposition sensor (e.g. the first and/or second deposition sensor) may be attached to (e.g. fixedly attached to) the movable mount. The at least one deposition sensor (e.g. the first and/or second deposition sensor) may move with the movable mount.

The at least one deposition sensor (e.g. the first and/or second deposition sensor) may be mounted within the drum. One or more apertures may be provided in the drum. The one or more apertures may be located directly between the at least one deposition sensor (e.g. the first and/or second deposition sensor) and the at least one (e.g. first and/or second) magnetron sputtering device, such that (i.e. some of the) material sputtered by the at least one (e.g. first and/or second) magnetron sputtering device reaches and is deposited on the at least one deposition sensor (e.g. the first and/or second deposition sensor). The one or more apertures may extend around a circumference of the drum. Alternatively, the one or more apertures may be spaced out around the circumference of the drum (i.e. such that there is solid material forming the drum between each aperture). It may be that, as the drum rotates, (i.e. some of the) material sputtered by the at least one (e.g. first and/or second) magnetron sputtering device reaches and is deposited onto the at least one deposition sensor (e.g. the first and/or second deposition sensor) when the one or more apertures are provided directly between the at least one deposition sensor (e.g. the first and/or second deposition sensor) and the at least one (e.g. first and/or second) magnetron sputtering device, and that material sputtered by the at least one (e.g. first and/or second) magnetron sputtering device is prevented from being deposited onto the at least one deposition sensor (e.g. the first and/or second deposition sensor) when the one or more apertures rotated out of alignment with the at least one (e.g. first and/or second) magnetron sputtering devices.

A second aspect of the invention provides a method for depositing one or more variable interference filters onto one or more substrates. The method comprises: at least one magnetron sputtering device sputtering material from a sputtering target to thereby define a sputtering zone within a vacuum chamber; at least one mount moving the one or more substrates through the sputtering zone; and providing at least one static sputtering mask between the sputtering target and the mount, the at least one static sputtering mask being configured (e.g. shaped) such that a layer of material having a non-uniform thickness is deposited on each substrate moved through the sputtering zone.

It may be that the layer of material has a non-uniform thickness along at least one direction (i.e. in the said layer). The method may comprise the at least one mount moving the one or more substrates linearly (i.e. along a (e.g. substantially) straight line) through the sputtering zone. The at least one direction along which the layer of material is non-uniform is typically perpendicular to the (i.e. linear) direction of motion of each substrate through the sputtering zone.

The layer of material deposited on each substrate typically comprises a few monolayers of material, wherein a monolayer of material is one atom (or molecule) thick. For example, the layer of material deposited on each substrate typically comprises fewer than 30 monolayers of material, or more typically fewer than 20 monolayers of material, or more typically fewer than 10 monolayers of material. The number of monolayers typically varies across the surface of each substrate.

The at least one static sputtering mask is typically configured (e.g. shaped) to restrict (e.g. block or prevent) some of the material sputtered from the sputtering target from reaching the one or more substrates, such that the layer of material having a non-uniform thickness is deposited on each substrate moved through the sputtering zone.

The at least one static sputtering mask may comprise a mask body configured (e.g. shaped) to restrict (e.g. block or prevent) some of the material sputtered from the sputtering target from reaching the one or more substrates. The at least one static sputtering mask body may be configured (e.g. shaped) such that the layer of material deposited on each of the one or more substrates has a non-uniform thickness (i.e. a thickness which varies spatially across the said layer).

One or more apertures may extend through the at least one static sputtering mask (e.g. the at least one static sputtering mask body). The one or more apertures extending through the at least one static sputtering mask (e.g. the at least one static sputtering mask body) are typically configured (e.g. shaped) such that the layer of material deposited on each of the one or more substrates has a non-uniform thickness (i.e. a thickness which varies spatially across the said layer). The one or more apertures are typically configured such that (i.e. some of the) material sputtered from the sputtering target (i.e. in use) passes through the said one or more apertures and is not restricted (e.g. blocked or prevented) from reaching the one or more substrates by the at least one static sputtering mask (e.g. the at least one static sputtering mask body). The at least one static sputtering mask (e.g. the at least one static sputtering mask body) may comprise a wire grille comprising a plurality of apertures.

The one or more apertures may be symmetric (e.g. have reflection symmetry). The one or more apertures may be symmetrically arranged. The at least one static sputtering mask may comprise two symmetrically arranged apertures.

The at least one static sputtering mask (e.g. the at least one static sputtering mask body and/or the one or more apertures) are typically configured to direct a non-uniform wavefront of material (i.e. sputtered from the sputtering target) towards the mount.

It may be that the at least one static sputtering mask (i.e. the at least one static sputtering mask body and/or the one or more apertures) is configured (e.g. shaped) such that the layer of material deposited on each substrate varies in thickness along a first direction (i.e. in the plane of the layer). It may be that the at least one static sputtering mask (i.e. the at least one static sputtering mask body and/or the one or more apertures) is configured (e.g. shaped) such that the layer of material deposited on each substrate varies continuously in thickness along the first direction (i.e. in the plane of the layer). It may be that the at least one static sputtering mask (i.e. the at least one static sputtering mask body and/or the one or more apertures) is configured (e.g. shaped) such that the layer of material deposited on each substrate varies monotonically in thickness along the first direction (i.e. in the plane of the layer). It may be that the at least one static sputtering mask (i.e. the at least one static sputtering mask body and/or the one or more apertures) is configured (e.g. shaped) such that the layer of material deposited on each substrate varies linearly in thickness along the first direction (i.e. in the plane of the layer). It may be that the at least one static sputtering mask (i.e. the at least one static sputtering mask body and/or the one or more apertures) is configured (e.g. shaped) such that the layer of material deposited on each substrate varies (e.g. linearly, continuously and/or monotonically) in thickness along the first direction (i.e. in the plane of the layer) in two or more regions and such that the layer of material is (i.e. substantially) uniform (i.e. constant) in thickness along the first direction in one or more regions between the said two or more regions.

It may be that the at least one static sputtering mask (i.e. the at least one static sputtering mask body and/or the one or more apertures) is configured (e.g. shaped) such that the layer of material deposited on each substrate is (e.g. substantially) uniform (i.e. constant) in thickness along a second direction (i.e. in the plane of the layer). The second direction may be perpendicular to the first direction.

It may be that the at least one magnetron sputtering device, the at least one sputtering target, the at least one static sputtering mask (i.e. the at least one static sputtering mask body and/or the one or more apertures) and the at least one mount are configured (e.g. arranged, for example located and oriented) such that the layer of material deposited on each substrate varies (e.g. continuously, monotonically and/or linearly) in thickness along the first direction and is (e.g. substantially) uniform (i.e. constant) in thickness along the second direction.

It may be that the at least one static sputtering mask (i.e. the at least one static sputtering mask body and/or the one or more apertures) is configured (e.g. shaped) such that a wedge-shaped layer of material is deposited on each substrate.

The one or more apertures may be (e.g. substantially) elongate. The one or more apertures may be three-sided. The one or more apertures may be (e.g. substantially) triangular. The one or more apertures may be (e.g. substantially) wedge-shaped (i.e. cuneiform). The one or more apertures may be (e.g. substantially) tapered. The one or more apertures may extend (e.g. taper) along a direction (e.g. substantially) parallel to the first direction (i.e. along which the thickness of the layer of material varies). The one or more apertures may extend (e.g. taper) along a direction (e.g. substantially) perpendicular to a direction of travel of the said one or more substrates through the sputtering zone.

The one or more apertures may each comprise two or more (e.g. substantially) elongate aperture portions. The one or more apertures may each comprise two or more three-sided aperture portions. The one or more apertures may each comprise two or more (e.g. substantially) triangular aperture portions. The one or more apertures may each comprise two or more (e.g. substantially) wedge-shaped (i.e. cuneiform) aperture portions. The one or more apertures may each comprise two or more (e.g. substantially) tapered aperture portions. The two or more aperture portions may extend (e.g. taper) along a direction (e.g. substantially) parallel to the first direction (i.e. along which the thickness of the layer of material varies). The two or more aperture portions may extend (e.g. taper) along a direction (e.g. substantially) perpendicular to a direction of travel of the said one or more substrates through the sputtering zone. The two or more aperture portions may be symmetrically arranged (e.g. have reflection symmetry).

It may be that the at least one static sputtering mask is adjustable. For example, it may be that the least one static sputtering mask is adjustable in shape. It may be that the at least one static sputtering mask body is adjustable in shape. It may be that the one or more apertures are adjustable in shape. The characteristics (e.g. thickness variation) of the layer of material deposited on each substrate may therefore be calibrated by adjusting the at least one static sputtering mask (e.g. the at least one static sputtering mask body and/or the one or more apertures).

The skilled person will understand that by use of the term "static" in "at least one static sputtering mask" it is meant that the at least one sputtering mask is fixed in position. For example, the at least one static sputtering mask is typically fixed in position relative to the sputtering target. The at least one static sputtering mask may be fixedly mounted to the at least one magnetron sputtering device. The at least one static sputtering mask may form part of the at least one magnetron sputtering device. The at least one static sputtering mask is not typically (e.g. fixedly) mounted to the at least one mount or to the one or more substrates. The at least one static sputtering mask does not typically move when the at least one mount moves.

However, the at least one static sputtering mask is not necessarily permanently fixed in position (e.g. relative to the sputtering target). The position and/or the orientation of the at least one static sputtering mask may be adjustable. For example, the position and/or the orientation of the at least one static sputtering mask may be adjustable between two more fixed positions and/or orientations.

The method may be a method for depositing one or more linear variable interference filters. A linear variable interference filter is a variable interference filter whose spectral properties (i.e. wavelength dependence of the filter's transmittance and/or reflectance) vary linearly along one dimension of the said filter. The spectral properties of the linear variable interference filter may vary linearly along a length of the linear variable interference filter. The linear variable interference filter may be (e.g. substantially) elongate. The spectral properties may vary linearly along a length of the (e.g. substantially) elongate linear variable interference filter.

The method may be a method for depositing one or more non-linear variable interference filters. A non-linear variable interference filter is a variable interference filter whose spectral properties (i.e. wavelength dependence of the filter's transmittance and/or reflectance) vary non-linearly along at least one dimension of the said filter. The spectral properties of the non-linear variable interference filter may vary continuously along the at least one dimension of the said filter. The spectral properties of the non-linear variable interference filter may vary monotonically along the at least one dimension of the said filter. The spectral properties of the non-linear variable interference filter may vary non-linearly (but e.g. continuously and/or monotonically) along a length of the non-linear variable interference filter. The non-linear variable interference filter may be (e.g. substantially) elongate and the spectral properties may vary non-linearly (but e.g. continuously and/or monotonically) along a length of said (e.g. substantially) elongate non-linear variable interference filter.

The spectral properties of the at least one variable interference filter may be (i.e. substantially) constant along one or more (i.e. discrete) portions of the length of the said at least one variable interference filter. For example, it may be that the spectral properties are (i.e. substantially) constant along one or more (i.e. discrete) portions of the length of the said at least one variable interference filter and that the spectral properties vary (e.g. linearly, non-linearly, continuously, and/or monotonically) along one or more (i.e. intervening, discrete) portions of the length of the said at least one variable intereference filter between the portions along which the spectral properties are (i.e. substantially) constant. The at least one variable interference filter may be (e.g. substantially) elongate and the one or more (i.e. discrete) portions along which the spectral properties are (i.e. substantially) constant may extend along the length of the said (e.g. substantially) elongate variable interference filter.

The variable interference filter may be a variable high-pass interference filter. The variable interference filter may be a variable low-pass interference filter. The band-edges of the variable high-pass or low-pass interference filters typically vary (e.g. continuously, monotonically and/or linearly) along at least one dimension of the said filters.

The variable interference filter may be a variable band-pass interference filter. The central wavelength of the passband of the variable band-pass interference filter typically varies (e.g. continuously, monotonically and/or linearly) along at least one dimension of the said filter.

The variable interference filter may be a variable notch interference filter. The central wavelength of the stopband of the variable notch interference filter typically varies (e.g. continuously, monotonically and/or linearly) along at least one dimension of the said filter.

The one or more variable interference filters (e.g. the one or more linear or non-linear variable interference filters) may be one or more variable IR interference filters, that is to say one or more variable interference filters configured to selectively transmit and/or reflect light having one or more wavelengths within the IR spectrum (i.e. having wavelengths within the range 700 nm to 1,000,000 nm, or more typically within the range 2000 nm to 14000 nm).

The skilled person will understand that by sputtering we mean ejecting particles (e.g. atoms) from a solid sputtering target by bombarding the said target with energetic particles such as gas ions. Sputtering typically involves applying an electric field between the sputtering target and the substrate onto which material is to be sputtered such that the sputtering target functions as a cathode. Sputtering using a magnetron sputtering device typically further comprises igniting a plasma in an inert gas (such as argon) adjacent to the target and confining the inert gas plasma close to the surface of the target using a magnetic field generated by an array of magnets (e.g. typically permanent magnets) arranged around the target. The electric field accelerates gas ions from the plasma into the surface of the target, resulting in the ejection of uncharged particles from the target, which are subsequently deposited onto the substrate.

It may be that the electric field is applied between the at least one sputtering target and the at least one static sputtering mask, that is to say the at least one static sputtering mask may function as an anode.

The method may comprise providing at least a portion of the at least one magnetron sputtering device within the vacuum chamber. For example, the method may comprise providing the sputtering target within the vacuum chamber. Alternatively, the method may comprise providing at least a portion of the at least one magnetron sputtering device in fluid communication with the interior of the vacuum chamber such that material may be transported between the at least one magnetron sputtering device and the interior of the vacuum chamber (e.g. material may be sputtered from the sputtering target in the at least one magnetron sputtering device into the vacuum chamber).

The at least one magnetron sputtering device may be a planar magnetron sputtering device, that is to say the magnetron sputtering device may be configured to generate a (e.g. substantially) planar sputtering plasma adjacent to the sputtering target (i.e. the plasma may be (e.g. substantially) confined to one plane). The at least one magnetron sputtering device may be a rectangular (e.g. linear) magnetron sputtering device, that is to say the magnetron sputtering device may be configured to generate a (e.g. substantially) rectangular sputtering plasma adjacent to the sputtering target (i.e. the plasma may be confined in a plane to a (e.g. substantially) rectangular shape).

The at least one magnetron sputtering device may be a direct current (DC) magnetron sputtering device. In a DC magnetron sputtering device, the electric field is generated between the sputtering target and the one or more substrates using a DC power source. DC magnetron sputtering is most suitable for sputtering electrically conductive metal targets. Conventional DC magnetron sputtering is less suitable for sputtering dielectric targets where charge build-up on the target due to deposition of plasma ions can lead to excessive arcing in the plasma and poisoning of the target. Accordingly, the method may comprise the at least one magnetron sputtering device sputtering metal from a metal sputtering target.

Alternatively, the at least one magnetron sputtering device may be a radio frequency (RF) magnetron sputtering device. In an RF magnetron sputtering device, the electric field is generated between the sputtering target and the one or more substrates using a radio-frequency alternating current (AC) power source. RF magnetron sputtering is suitable for sputtering both metal targets and dielectric targets as plasma ion charges are not able to build up on the target due to the oscillating electric field.

It may be that the at least one magnetron sputtering device is a pulsed RF magnetron sputtering device.

It may be that the at least one magnetron sputtering device is a pulsed DC magnetron sputtering device, that is to say a DC magnetron sputtering device configured such that the DC electric field is repeatedly pulsed. Pulsing of the DC electric field may comprise switching the electric field on and off. Pulsing of the DC electric field may comprise varying (e.g. switching) the magnitude of the electric field, for example between first and second magnitudes. Pulsing of the DC electric field may comprise varying (e.g. switching) the polarity of the electric field, for example between first and second polarities (i.e. bipolar switching). Pulsing of the DC electric field may occur at a frequency of between 10 kHz to 350 kHz. Pulsing of the DC electric field repeatedly removes inert gas ions from the surface of the target. Pulsed DC magnetron sputtering is therefore suitable for sputtering both metal and dielectric targets.

The method may comprise the at least one mount moving the one or more substrates through the sputtering zone in a direction (e.g. substantially) perpendicular to the first direction (i.e. the first direction along which the thickness of the deposited layer varies).

The method may comprise the at least one mount moving the one or more substrates through the sputtering zone in a direction (e.g. substantially) parallel to the second direction (i.e. the second direction along which the thickness of the deposited layer is (e.g. substantially) uniform, e.g. constant). It may be that the direction of movement of the one or more substrates through the sputtering zone defines the said first and second directions.

The at least one mount may be rotatable. The method may comprise rotating the at least one mount and thereby moving the one or more substrates (i.e. supported by the said at least one mount) through the sputtering zone. The method may comprise rotating the at least one mount and thereby moving the one or more substrates through the sputtering zone in a direction (e.g. substantially) perpendicular to the first direction (i.e. the first direction along which the thickness of the deposited layer varies). The method may comprise rotating the at least mount and thereby moving the one or more substrates through the sputtering zone in a direction (e.g. substantially) perpendicular to the direction in which the one or more apertures extend (e.g. taper).

The method may comprise rotating the at least one mount about an axis (e.g. substantially) parallel to the first direction (in which the layer of material deposited on the one or more substrates varies in thickness). The method may comprise rotating the at least one mount about an axis (e.g. substantially) parallel to the direction in which the one or more apertures extend (e.g. taper). The method may comprise rotating the at least one mount about a (e.g. substantially) horizontal axis.

The at least one mount may be a drum. The drum may be (e.g. substantially) prismatic (e.g. cylindrical). The drum may have the shape of a convex regular polygonal prism. The drum may be rotatable about a longitudinal axis thereof (e.g. an axle extending along said longitudinal axis). The drum may be rotatable about a (i.e. substantially) horizontal longitudinal axis thereof. Alternatively, the drum may be rotatable about a (i.e. substantially) vertical longitudinal axis thereof. The drum is typically configured to support the one or more substrates. For example, one or more externally facing walls of the drum may be configured to support the one or more substrates.

It may be that the drum is configured to support one substrate. It may be that one externally facing wall of the drum is configured to support the said one substrate.

It may be that the drum is configured to support two or more substrates. It may be that one externally facing wall of the drum is configured to support the said two or more substrates. Alternatively, it may be that two or more externally facing walls of the drum are configured to support the two or more substrates. It may be that each of the two or more externally facing walls of the drum is configured to support a single corresponding substrate of the one or more substrates.

The method may comprise confining sputtered material within the sputtering zone (for example, by way of one or more baffles). The method may comprise restricting (e.g. preventing) sputtered material from escaping from the sputtering zone into the rest of the vacuum chamber. The method may comprise restricting (e.g. preventing) particles (e.g. atoms, ions, molecules or molecular fragments) from entering the sputtering zone from the rest of the vacuum chamber.

The method may comprise two or more magnetron sputtering devices sputtering material from corresponding sputtering targets towards the mount, each magnetron sputtering device thereby defining a respective sputtering zone within the vacuum chamber. The method may comprise the at least one mount moving the one or more substrates through each said sputtering zone. The method may comprise providing at least one corresponding static sputtering mask between each sputtering target and the mount, each said static sputtering mask being configured (e.g. shaped) such that a layer of material having a non-uniform thickness is deposited on each substrate moved through each sputtering zone.

For example, the method may comprise a first magnetron sputtering device sputtering material from a first sputtering target towards the mount, thereby defining a first sputtering zone within the vacuum chamber, and a second magnetron sputtering device sputtering material from a second sputtering target towards the mount, thereby defining a second sputtering zone within the vacuum chamber. The method may comprise the at least one mount moving the one or more substrates through both the first and second sputtering zones. The method may comprise providing a first static sputtering mask between the first sputtering target and the mount, the first static sputtering mask being configured (e.g. shaped) such that a first layer of material having a non-uniform thickness is deposited on each substrate moved through the first sputtering zone. The method may comprise providing a second static sputtering mask between the second sputtering target and the mount, the second static sputtering mask being configured (e.g. shaped) such that a second layer of material having a non-uniform thickness is deposited on each substrate moved through the second sputtering zone.

The at least one sputtering target (e.g. the first sputtering target and/or the second sputtering target) may comprise (e.g. consist of) metal. The at least one sputtering target (e.g. the first sputtering target and/or the second sputtering target) may comprise (e.g. consist of) one or more elemental metals. The at least one sputtering target (e.g. the first sputtering target and/or the second sputtering target) may comprise (e.g. consist of) one or more metal alloys. The at least one sputtering target (e.g. the first sputtering target and/or the second sputtering target) may comprise (e.g. consist of) one or more of: titanium, tantalum, niobium, aluminium, silver, gold, hafnium.

The at least one sputtering target (e.g. the first sputtering target and/or the second sputtering target) may comprise (e.g. consist of) non-metal or metalloid. The at least one sputtering target (e.g. the first sputtering target and/or the second sputtering target) may comprise (e.g. consist of) one or more elemental non-metals or metalloids. The at least one sputtering target (e.g. the first sputtering target and/or the second sputtering target) may comprise (e.g. consist of) one or more of the following: silicon, carbon, germanium, cadmium telluride (CdTe), lead telluride (PbTe).

The method may comprise at least one ionic treatment device directing gas ions towards the mount, thereby defining a ionic treatment zone within the vacuum chamber. The method may comprise the at least one mount moving the one or more substrates through the ionic treatment zone. It may be that movement of the one or more substrates through the ionic treatment zone results in a chemical change of one or more layers of material located on the said one or more substrates.

The at least one ionic treatment device may be at least one oxidation device, that is to say a device comprising a source of oxygen ions. The method may comprise the at least one oxidation device directing oxygen ions towards the mount, thereby defining an oxidising treatment zone within the vacuum chamber. The method may comprise the at least one mount moving the one or more substrates through the oxidising treatment zone. It may be that movement of the one or more substrates through the oxidising treatment zone results in oxidation of one or more layers of material located on the said one or more substrates.

The at least one ionic treatment device may be at least one plasma processing device. The at least one plasma processing device typically comprises a source of plasma. The source of plasma typically comprises a source of gas (i.e. a source of gas atoms and/or molecules) and means for igniting a plasma within the gas. The at least one plasma processing device may be a microwave plasma device, that is to say that the means for igniting the plasma may comprise a source of microwave radiation. The method may comprise the at least one plasma processing device directing gas ions generated by the plasma towards the mount, thereby defining a plasma treatment zone within the vacuum chamber. The method may comprise the at least one mount moving the one or more substrates through the plasma treatment zone.

Gas ions may be deposited on one or more substrates moved through the plasma treatment zone. Gas ions may react with one or more substrates moved through the plasma treatment zone. Gas ions may react with one or more layers of material located on the one or more substrates moved through the plasma treatment zone.

It may be that the gas supplied by the plasma processing device comprises oxygen and that the method comprises the at least one plasma processing device directing oxygen ions towards the mount, thereby defining a plasma oxidation zone within the vacuum chamber. It may be that movement of the one or more substrates through the plasma oxidation zone results in oxidation of one or more layers of material located on the said one or more substrates.

The method may comprise the at least one mount moving the one or more substrates sequentially through the sputtering zone and through the plasma treatment zone.

It may be that the sputtering target is metal. It may be that the method comprises the at least one magnetron sputtering device depositing a layer of sputtered metal having a non-uniform thickness onto each substrate moved through the sputtering zone. It may be that the method comprises the at least one plasma processing device oxidising each said layer of sputtered metal on each substrate moved through the plasma treatment zone (e.g. the plasma oxidation zone). The method may therefore comprise depositing one or more layers of metal oxide (i.e. dielectric) material onto the one or more substrates.

In methods utilising two or more magnetron sputtering devices, the methods may comprise one or more (e.g. each) of the said magnetron sputtering devices depositing different metals onto the one or more substrates moved through the corresponding sputtering zones. For example, in methods utilising first and second magnetron sputtering devices, the methods may comprise the first magnetron sputtering device depositing a first layer of a first metal on each substrate moved through the first sputtering zone and the second magnetron sputtering device depositing a second layer of a second metal on each substrate (e.g. onto the first layer) moved through the second sputtering zone. The method may comprise oxidising the first and/or second layers of metal on movement of each substrate through the plasma treatment zone (e.g. plasma oxidation zone). The method may comprise repeatedly moving the one or more substrates through each of the sputtering zones (e.g. the first and second sputtering zones) and the plasma treatment zone (e.g. plasma oxidation zone), thereby depositing alternating layers of metal oxide on each substrate.

The method may comprise a first of the two or more magnetron sputtering devices depositing a first material onto the one or more substrates moved through the corresponding first sputtering zone while the others of the two or more magnetron sputtering devices are switched off. The method may comprise the first of the two or more magnetron sputtering devices depositing the first material onto the one or more substrates moved repeatedly through the corresponding first sputtering zone while the others of the two or more magnetron sputtering devices are switched off. Accordingly, a layer of first material having a desired thickness may be built up on the one or more substrates over repeated passes through the first sputtering zone. If the one or more substrates are also moved through a plasma oxidation zone, a layer of first material oxide (e.g. first metal oxide) having a desired thickness may be built up on the one or more substrates over repeated passes through the first sputtering zone and the plasma oxidation zone. The method may comprise a second of the two or more magnetron sputtering devices depositing a second material onto the one or more substrates moved through the corresponding second sputtering zone while the others of the two or more magnetron sputtering devices are switched off. The method may comprise the second of the two or more magnetron sputtering devices depositing the second material onto the one or more substrates moved repeatedly through the corresponding second sputtering zone while the others of the two or more magnetron sputtering devices are switched off. Accordingly, a layer of second material having a desired thickness may be built up on the one or more substrates over repeated passes through the second sputtering zone. If the one or more substrates are also moved through the plasma oxidation zone, a layer of second material oxide (e.g. second metal oxide) having a desired thickness may be built up on the one or more substrates over repeated passes through the second sputtering zone and the plasma oxidation zone. Alternating layers of first material and second material, or first material oxide (e.g. first metal oxide) and second material oxide (e.g. second metal oxide), may consequently be formed.

Additionally or alternatively, it may be that both the first and second of the two or more magnetron sputtering devices are switched on (i.e. simultaneously) and that the method comprises the first magnetron sputtering device depositing the first material onto the one or more substrates moved through the corresponding first sputtering zone and the second magnetron sputtering device depositing the second material onto the one or more substrates moved through the corresponding second sputtering zone. The method may comprise the first of the two or more magnetron sputtering devices depositing the first material onto the one or more substrates moved repeatedly through the corresponding first sputtering zone and the second of the two or more magnetron sputtering devices depositing the second material onto the one or more substrates moved repeatedly through the corresponding second sputtering zone. Accordingly, a layer comprising both first and second material having a desired thickness may be built up on the one or more substrates over repeated passes through both the first and second sputtering zones. If the one or more substrates are also moved through the plasma oxidation zone, a layer comprising first and second material oxides (e.g. first and second metal oxides) having a desired thickness may be built up on the one or more substrates over repeated passes through both the first and second sputtering zones and the plasma oxidation zone. A layer comprising both first and second material oxides (e.g. first and second metal oxides) typically has a refractive index intermediate the refractive index of a layer consisting predominantly (i.e. entirely) of first material oxide (e.g. first metal oxide) and the refractive index of a layer consisting predominantly (i.e. entirely) of second material oxide (e.g. second metal oxide).

The method is typically carried out at room temperature.

The one or more substrates may be one or more glass substrates. The one or more substrates may be one or more borosilicate glass substrates (e.g. formed from BK7 glass). The one or more substrates may be one or more zinc sulphide substrates. The one or more substrates may be one or more germanium substrates.

The one or more substrates may be one or more chalcogenide substrates (e.g. formed from chalcogenide glass such as germanium-sulphide (Ge—S) glass). Chalcogenide glasses typically have high refractive indices and low softening temperatures and transmit infrared light across a broad band of wavelengths.

The method may comprise at least one deposition sensor measuring a parameter indicative of the amount of material deposited onto a sensing surface of the said deposition sensor. The method may comprise at least one deposition sensor measuring a parameter indicative of the rate at which material is deposited onto a sensing surface of the said deposition sensor.

The method may comprise the deposition sensor measuring a parameter indicative of the amount of material deposited onto the one or more substrates. The method may comprise the deposition sensor measuring a parameter indicative of the rate at which material is deposited onto the one or more substrates.

The method may comprise a controller receiving measurements of the said parameter (i.e. the parameter indicative of the amount of material deposited and/or the rate at which material is deposited onto the sensing surface and/or the one or more substrates) from the deposition sensor. The method may comprise the controller causing a change in the movement of the at least one movable mount responsive to the received measurements. The method may comprise the controller causing a change in the speed of the movement of the at least one movable mount responsive to the received measurements. The method may comprise the controller causing a change in the speed of rotation of the at least one movable mount responsive to the received measurements. The method may comprise the controller causing a change in the intensity of sputtering at the at least one (e.g. first and/or second) magnetron sputtering device responsive to the received measurements. The method may comprise the controller causing a change in the amount of power supplied to the at least one (e.g. first and/or second) magnetron sputtering device responsive to the said received measurements. The method may comprise the controller switching the at least one (e.g. first and/or second) magnetron sputtering device on or off responsive to the received measurements.

The method may comprise a first deposition sensor measuring a first parameter indicative of the amount of first material deposited (and/or the rate at which first material is deposited) onto a sensing surface of the said first deposition sensor from the first magnetron sputtering device and/or the amount of first material deposited (and/or the rate at which first material is deposited) onto the one or more substrates. The method may comprise a second deposition sensor measuring a second parameter indicative of the amount of second material deposited (and/or the rate at which second material is deposited) onto a sensing surface of the said second deposition sensor from the second magnetron sputtering device and/or the amount of second material deposited (and/or the rate at which second material is deposited) onto the one or more substrates. The method may comprise a controller receiving measurements of the first parameter from the first deposition sensor and measurements of the second parameter from the second deposition sensor. The method may comprise the controller causing a change in the movement of the at least one movable mount (e.g. the speed of the movement of the at least one movable mount, for example the speed of rotation of the at least one movable mount) and/or the intensity of sputtering at the first magnetron sputtering device and/or the second magnetron sputtering device (e.g. the amount of power supplied to the first magnetron sputtering device and/or the second magnetron sputtering device) responsive to the said received measurements of the first parameter and/or the second parameter.

The at least one deposition sensor (e.g. the first and/or second deposition sensors) may (e.g. each) comprise a microbalance (e.g. a quartz crystal microbalance). The method may comprise the microbalance (e.g. the quartz crystal microbalance) measuring a parameter indicative of the resonant frequency of an acoustic resonator (e.g. a quartz crystal resonator).

The at least one deposition sensor (e.g. the first and/or second deposition sensor) may be static (i.e. the position of the at least one deposition sensor may be fixed). The at least one deposition sensor (e.g. the first and/or second deposition sensor) may be (e.g. fixedly) mounted within the vacuum chamber. The at least one deposition sensor (e.g. the first and/or second deposition sensor) may form part of the first and/or second magnetron sputtering devices.

The at least one deposition sensor (e.g. the first and/or second deposition sensor) may be attached to (e.g. fixedly attached to) the movable mount. The at least one deposition sensor (e.g. the first and/or second deposition sensor) may move with the movable mount.

The at least one deposition sensor (e.g. the first and/or second deposition sensor) may be mounted within the drum. One or more apertures may be provided in the drum. The one or more apertures may be located directly between the at least one deposition sensor (e.g. the first and/or second deposition sensor) and the at least one (e.g. first and/or second) magnetron sputtering device, such that (i.e. some of the) material sputtered by the at least one (e.g. first and/or second) magnetron sputtering device reaches and is deposited on the at least one deposition sensor (e.g. the first and/or second deposition sensor). The one or more apertures may extend around a circumference of the drum. Alternatively, the one or more apertures may be spaced out around the circumference of the drum (i.e. such that there is solid material forming the drum between each aperture).

A third aspect of the invention provides an optical device comprising a substrate and a variable interference filter deposited thereon by a method according to the second aspect of the invention. It may be that the substrate comprises two said variable interference filters located symmetrically thereon. Typically, the two said variable interference filters have reflection symmetry. Typically, the two said variable interference filters have thicknesses which vary in opposite orientations along the same axis.

A fourth aspect of the invention provides a variable interference filter comprising at least two sloping regions across which (e.g. in which) the thickness of the variable interference filter varies (e.g. continuously and/or monotonically, for example linearly and/or non-linearly) and one or more lower-gradient regions (e.g. one or more flat regions) therebetween across which (e.g. in which) the rate of change of thickness is less than the rate of change of thickness across each of the at least two sloping regions. It may be that the thickness of the variable interference filter is (i.e. substantially) constant (i.e. uniform) across the one or more lower-gradient regions (e.g. one or more flat regions). This usefully provides regions of the variable interference filter in which the wavelength cutoff (in the case of high-pass or low-pass interference filters) or the passband bandwidth (in the case of band-pass interference filters) is substantially constant, thereby increasing the amount of light which may be transmitted through the variable interference filter in those one or more regions (resulting in a stronger transmitted signal).

The variable interference filter may be (e.g. substantially) elongate. Each sloping region typically extends along (i.e. part of) the length of the (e.g. substantially) elongate variable interference filter, that is to say the thickness of the (e.g. substantially) elongate variable interference filter varies (e.g. continuously and/or monotonically, for example linearly and/or non-linearly) along (i.e. the said part of) the length of the (e.g. substantially) elongate variable interference filter. Each lower-gradient region typically extends along (i.e. part of) the length of the (e.g. substantially) elongate variable interference filter, that is to say the thickness of the (e.g. substantially) elongate variable interference filter may be (i.e. substantially) constant (i.e. uniform) across the said lower-gradient regions along (i.e. the said part of) the length of the (e.g. substantially) elongate variable interference filter.

A fifth aspect of the invention provides an optical device comprising a substrate and the variable interference filter according to the fourth aspect of the invention.

A sixth aspect of the invention provides an optical sensor comprising at least one light source, at least one variable interference filter according to the fourth aspect of the invention and at least one light detector. The at least one light detector may be configured (e.g. arranged) to receive light emitted by the at least one light source and transmitted through the at least one variable filter. The at least one light detector may be configured (e.g. arranged) to receive light emitted by the at least one light source and transmitted through at least one lower-gradient region of the at least one variable filter.

It may be that the sensor comprises two or more light detectors configured (e.g. arranged) to receive light emitted by the at least one light source and transmitted through the at least one lower-gradient region. It may be the sensor comprises two or more light detectors and that the at least one variable interference filter comprises two or more lower-gradient regions, each one of the two or more light detectors being configured (e.g. arranged) to receive light emitted by the at least one light source and transmitted through a corresponding one of the two or more lower-gradient regions (i.e. the two or more light detectors may be aligned with the two or more lower-gradient regions).

Where the rate of change of thickness of the at least one variable interference filter is lower (e.g. where the thickness of the at least one variable filter is (i.e. substantially) constant (i.e. uniform)), more light (i.e. a greater proportion of the light emitted by the at least one light source) is transmitted through the the at least one variable filter at a particular wavelength (e.g. within a particular wavelength range, or above or below a particular cutoff wavelength) than if the rate of change of thickness at the same location were greater. Accordingly, when aligned with the at least one lower-gradient region (or the two or more lower-gradient regions), the at least one light detector (e.g. the two or more light detectors) typically receives a higher intensity of light (for example a higher proportion of the light emitted by the at least one light source) at a particular wavelength (for example within a particular wavelength range, or above or below a particular cutoff wavelength) than if the said at least one light detector (e.g. the two or more light detectors) were aligned with at least one (e.g. two or more) of the at least two sloping regions or if the at least one variable interference filter were at least one linear variable interference filter.

Optional and preferred features of any one aspect of the invention may be features of any other aspect of the invention.

DESCRIPTION OF THE DRAWINGS

An example embodiment of the present invention will now be illustrated with reference to the following Figures in which.

DETAILED DESCRIPTION OF A FIRST EXAMPLE EMBODIMENT

Figure 1:
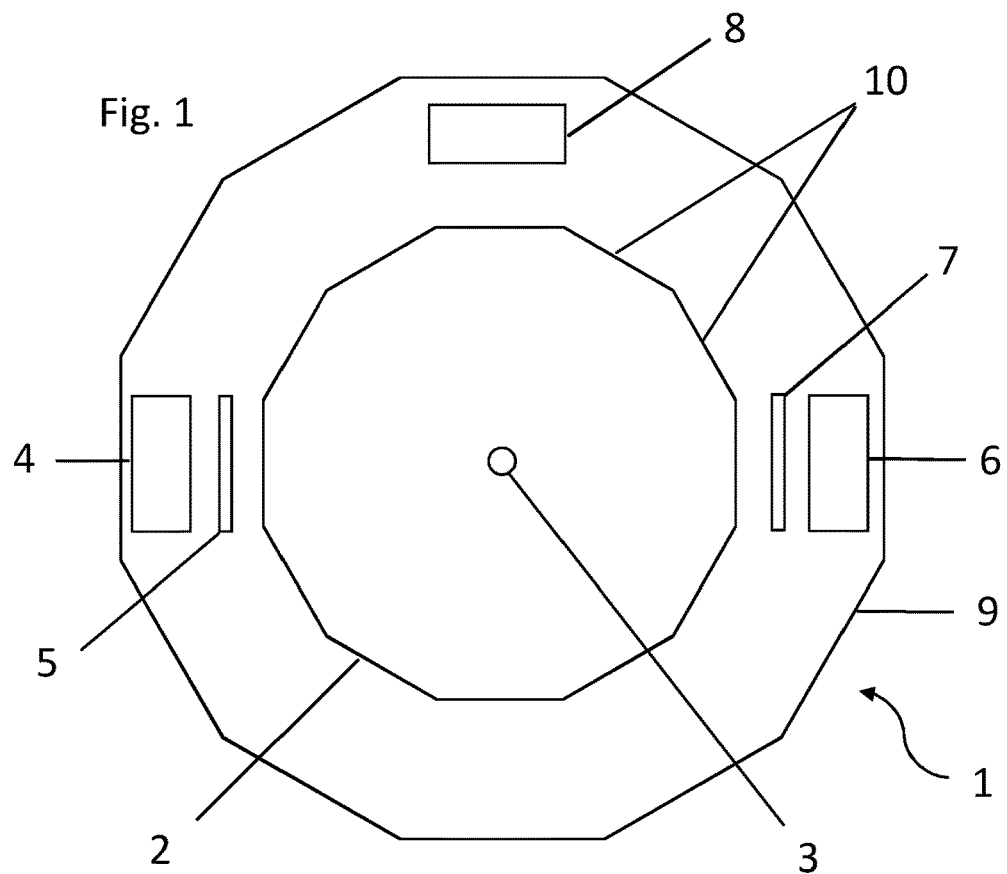
FIG. 1 shows a schematic cross section through variable interference filter deposition apparatus.

FIG. 1 shows schematically deposition apparatus 1 for depositing one or more variable interference filters. The apparatus 1 includes a rotatable drum mount 2 mounted on a substantially horizontal axle 3, first and second pulsed DC magnetron sputtering sources 4 and 6, each provided with respective adjustable sputtering masks 5 and 7, and a microwave plasma source 8, all provided within a vacuum chamber 9. The drum mount 2 has the shape of a dodecagonal prism, the axle 3 extending along the longitudinal axis of the prism and each external prism face 10 comprising a bracket for receiving a deposition substrate.

The first pulsed DC magnetron sputtering source 4 is set up such that, when turned on, it generates and confines a substantially rectangular, planar plasma adjacent to a titanium target, to thereby sputter titanium atoms towards the drum. The second pulsed DC magnetron sputtering source 6 is also set up such that, when turned on, it generates and confines a substantially rectangular, planar plasma adjacent to a silicon target, to thereby sputter silicon atoms towards the drum. The microwave plasma source 8 is supplied with a flow of oxygen gas to generate a flow of oxygen ions towards the drum.

Figure 2:
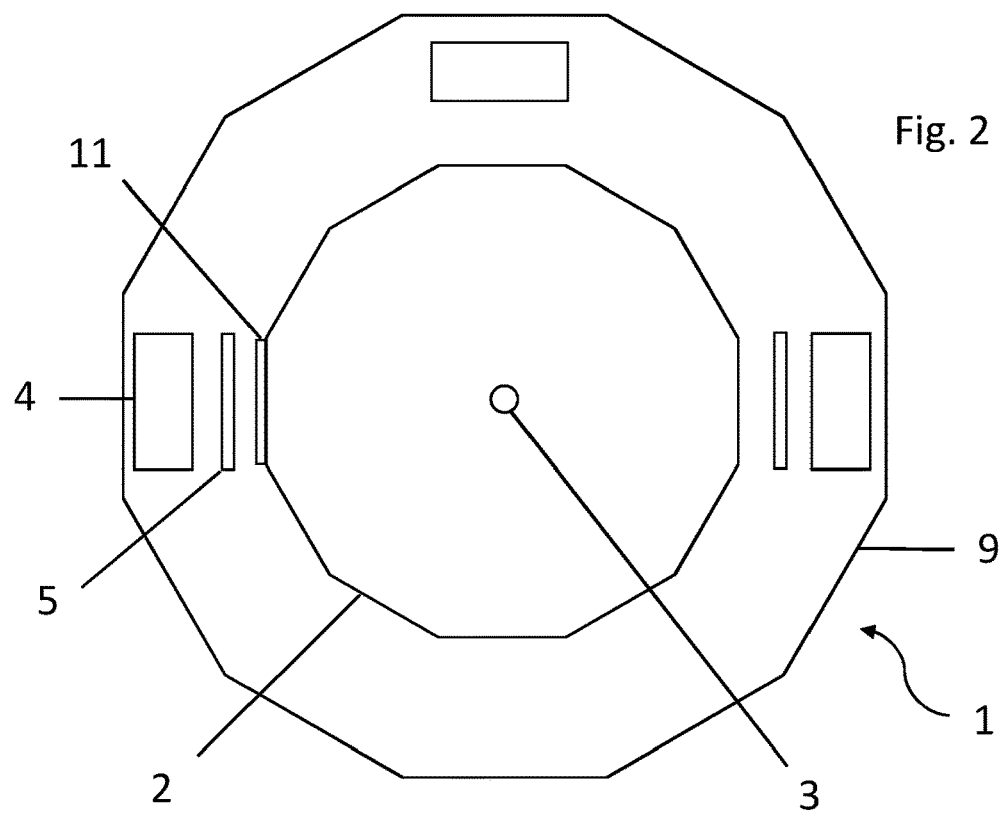
FIG. 2 shows the deposition apparatus of FIG. 1 with a substrate positioned in front of a first pulsed DC magnetron sputtering source.

In use, a glass substrate 11 is mounted on one of the flat external surfaces of the drum and the drum is rotated continuously about the axle 3 at a speed of 60 rpm. The vacuum chamber is evacuated and backfilled with argon or another inert gas. The first pulsed DC magnetron sputtering source 4 is switched on, as is the microwave plasma source 8. As shown in FIG. 2, the substrate 11 is first rotated past the first sputtering source 4, which sputters titanium atoms towards the drum. A portion of the sputtered material is blocked by the sputtering mask 5 but the remainder of the sputtered material is able to pass through the sputtering mask 5 to deposit a few monolayers of titanium onto the substrate.

Figure 3:
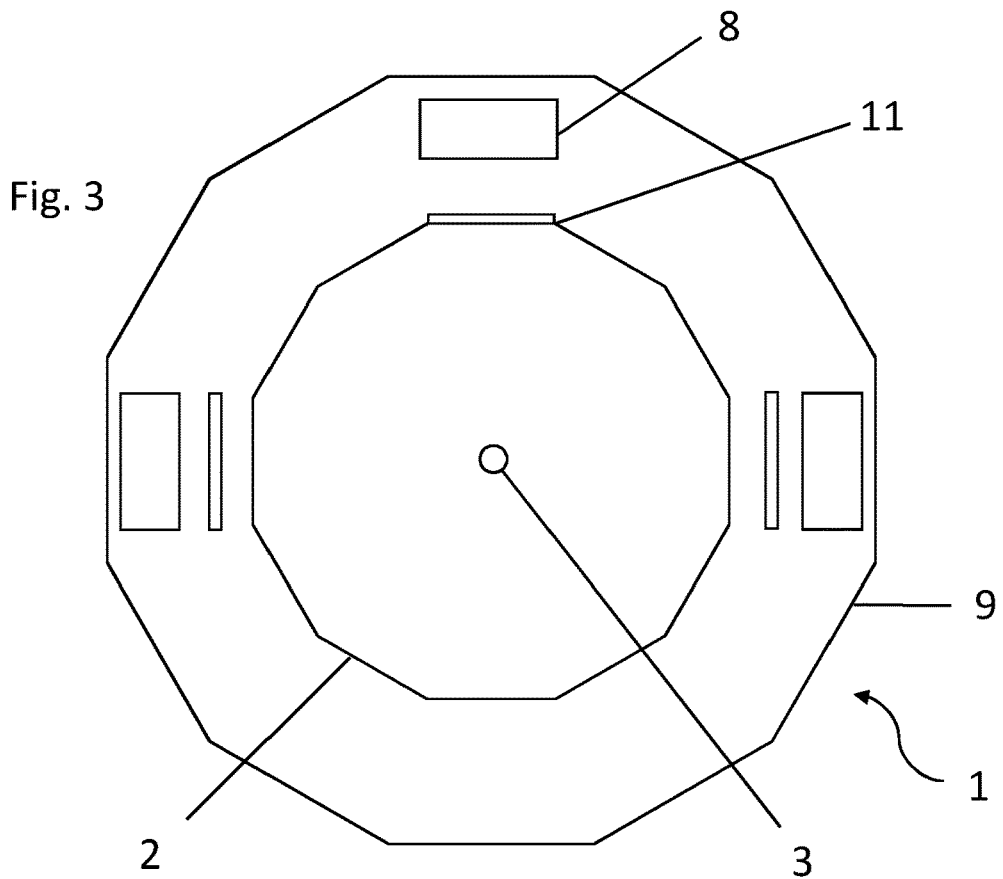
FIG. 3 shows the deposition apparatus of FIG. 1 with the substrate positioned in front of a microwave plasma source.
Figure 4:
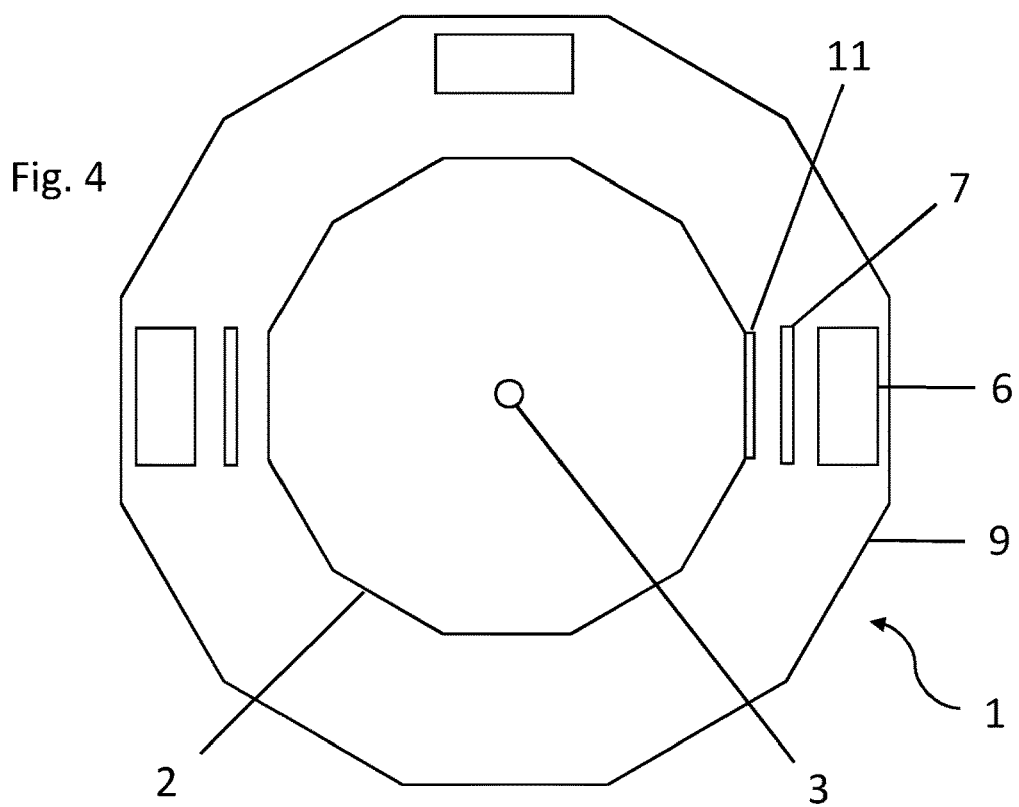
FIG. 4 shows the deposition apparatus of FIG. 1 with a substrate positioned in front of a second pulsed DC magnetron sputtering source.

As shown in FIG. 3, the substrate is subsequently rotated past the microwave plasma source 8. As the substrate passes the microwave plasma source 8, high-energy oxygen ions are directed onto the substrate which oxidise the previously deposited few monolayers of titanium, completely converting this into a layer of $TiO_2$.

Each time the substrate passes the first sputtering source 4, a few more monolayers of titanium are deposited onto the existing layers of $TiO_2$. Each time the substrate passes the plasma source 8, these monolayers of titanium are converted into $TiO_2$. Over repeated passes of the substrate past the first sputtering source and the plasma source, the thickness of a layer of $TiO_2$ is built up a few monolayers at a time until a desired thickness is achieved.

At this point the first sputtering source 4 is switched off and the second sputtering source 6 is switched on. As the substrate is rotated past the second sputtering source, a portion of the sputtered material is blocked by the sputtering mask 7 but the remainder of the sputtered material is able to pass through the sputtering mask 7 to deposit a few monolayers of silicon on top of the layer of $TiO_2$. The substrate is subsequently rotated past the plasma source which oxidises the silicon monolayers to form $SiO_2$. Over repeated passes of the substrate past the second sputtering source and the plasma source, the thickness of a layer of $SiO_2$ is built up a few monolayers at a time until a desired thickness is achieved.

As rotation of the drum continues, the first and second sputtering sources are repeatedly switched on and off to deposit alternating layers of $TiO_2$ and $SiO_2$ onto the substrate.

The rotational speed of the drum is such that only a few monolayers of material are deposited during each pass through each of the titanium and silicon sputtering zones, which provides precise control over the layer thicknesses and ensures that full oxidation of the sputtered titanium and silicon is possible in the microwave plasma oxidising zone, resulting in the formation of stoichiometric oxide layers. By physically separating metal deposition and oxidation zones, it is easier to control the thickness of the resultant metal oxide layers. In particular, it is easier to control and reproduce a gradient in thickness through the resultant metal oxide layers when metal deposition and oxidation steps are separated.

Figure 5:
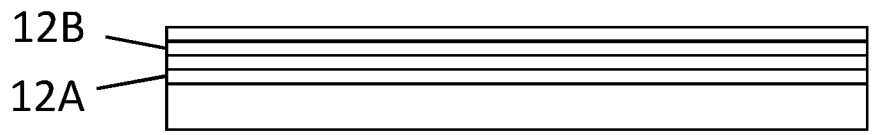
FIG. 5 shows a cross-section (along a first direction) through a layered variable interference structure deposited using the deposition apparatus of FIG. 1.
Figure 6:
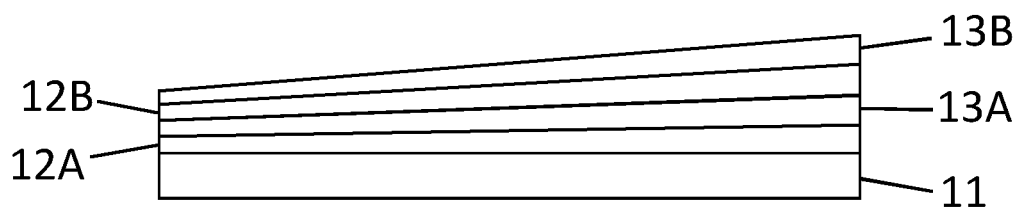
FIG. 6 shows a cross-section (along a second direction perpendicular to the first direction) through the layered variable interference structure of FIG. 5.

An example deposited layered structure is shown in FIGS. 5 and 6. Two layers of $TiO_2$, 12A and 12B, and two layers of $SiO_2$, 13A and 13B, have been deposited on the substrate, each individual layer itself comprising several monolayers of $TiO_2$ or $SiO_2$ respectively. The shape of the sputtering masks 5 and 7 have been selected to ensure that the thickness of each sputtered layer is uniform along a direction perpendicular to the axle (i.e. the thickness is uniform around the circumference of the drum), as can be seen in FIG. 5, but is non-uniform along a direction parallel to the axle, as can be seen in FIG. 6.

Figure 7:
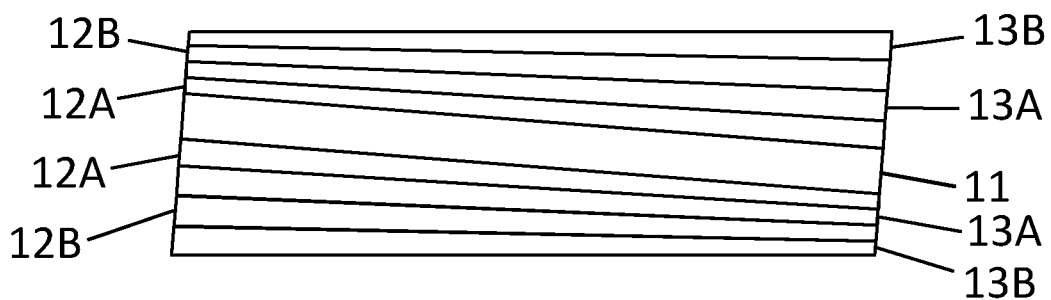
FIG. 7 shows a band-pass variable interference filter formed from two layered variable interference structures as shown in FIGS. 5 and 6.

Because the refractive index of $TiO_2$ is greater than that of $SiO_2$, this layered structure functions as an interference filter. Because the thicknesses of each layer of $TiO_2$ and $SiO_2$ vary along at least one dimension, the structure in fact functions as a variable interference filter. Depending on the layering pattern and the layer thicknesses, the deposited device may function as a high-pass interference filter or a low pass interference filter. Two such interference filters may be sequentially deposited on opposing faces of a substrate, or two such interference filters may be bonded together, to form a band-pass interference filter as shown in FIG. 7. The layer thickness for optical interference filters typically ranges from 50 nm to 200 nm.

In practice, one or more substrates may be mounted to each external, planar face of the drum, permitting a plurality of layered structures to be deposited at the same time. This significantly increases throughput compared to existing deposition technologies. The polygonal drum permits a high surface area of substrate to be coated for a given vacuum chamber volume.

The thickness variation of the layers of deposited material, and hence the spectral properties of the deposited interference filters, are controlled through the shape of the sputtering masks 5 and 7 as explained in more detail as follows.

DETAILED DESCRIPTION OF SPUTTERING MASK DESIGN

The inventors have developed a model used to simulate the thickness distribution of a film of material sputtered onto a substrate from a particular target. The model takes into account (i) the sputtering yield distribution across the sputtering target surface, (ii) the angular distribution of sputtered material, (iii) masking shielding, and (iv) the thin film growth process on a rotating drum. With this model the appropriate sputtering mask design can be obtained for a desired spatial thickness distribution.

Figure 8:
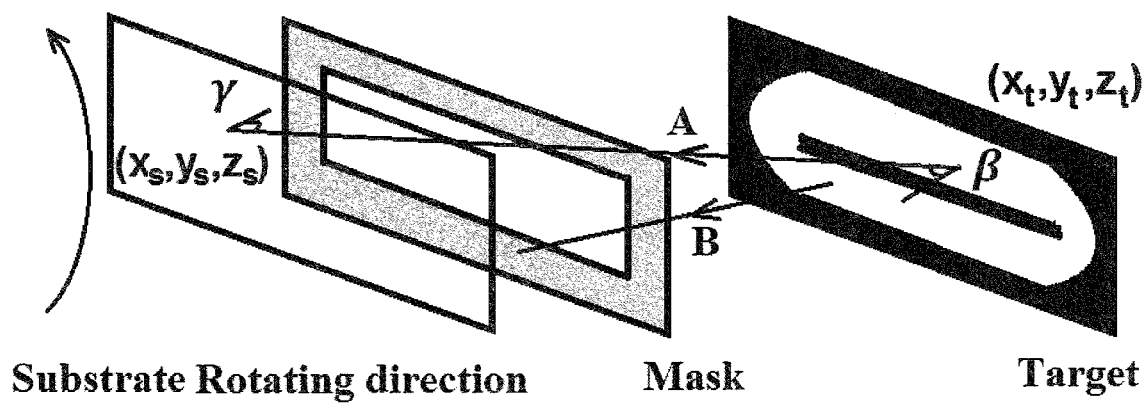
FIG. 8 shows schematically the path of atoms sputtered from a target towards a rotating substrate, a first atom following path A passing through a sputtering mask to reach the target and a second atom following path B being blocked by the sputtering mask.

As shown in FIG. 8, an emission angle, $\beta$, may be defined as the angle between the flux of atoms ejected from a target within the sputtering device and the normal to said target surface. Similarly, an incident angle, $\gamma$, is defined as the angle between the incident sputtered atom flux and the normal to the substrate surface. The path taken by sputtered atoms which reach the substrate through the sputtering mask is labelled A. The path taken by sputtered atoms which are blocked by the sputtering mask and therefore do not reach the substrate is labelled B.

The sputtering yield at the sputtering target is a function of the sputtered particle density, the applied magnetic field (which is used to confine the plasma adjacent to the sputtering target), the cathode voltage applied to the sputtering target and the gas pressure.

During deposition gas pressure and cathode voltage typically remain constant and can be assumed to be uniform across the whole target surface. Accordingly, it is not necessary to take into account gas pressure or cathode voltage when modelling the sputtering yield distribution.

The magnetic field, $B_{tan}$, measured tangential to the target surface, is typically highly non-uniform. This is reflected in the characteristically non-uniform erosion track profile formed on the target surface during sputtering. It has been found that, between maximum and minimum critical magnetic fields, ionisation is a linear function of the logarithm of a dimensionless magnetic field term, $\beta$, defined as $$\beta = \sqrt{\frac{e}{2m}} \left( \frac{a}{V_{dis}^{\frac{1}{2}}} \right) B_{tan}$$

where e is the electron charge, m is the electron mass, $\alpha$ is the distance from the centre of the target to the location at which the magnetic field is tangential to the target surface, and $V_{dis}$ is the cathode bias applied to the target. Accordingly, the relative yield distribution at the target surface can be obtained by measuring the tangential magnetic field $B_{tan}$. The magnetic field can be measured using a magnetometer or gauss meter, or using a Hall probe.

Alternatively, the relative yield distribution at the target surface can be obtained by measuring the erosion track profile directly. This method allows the target erosion speed (which is also related to the magnetic field $B_{tan}$) to be determined directly, and is more useful for accurate thickness distribution simulations.

Figure 9:
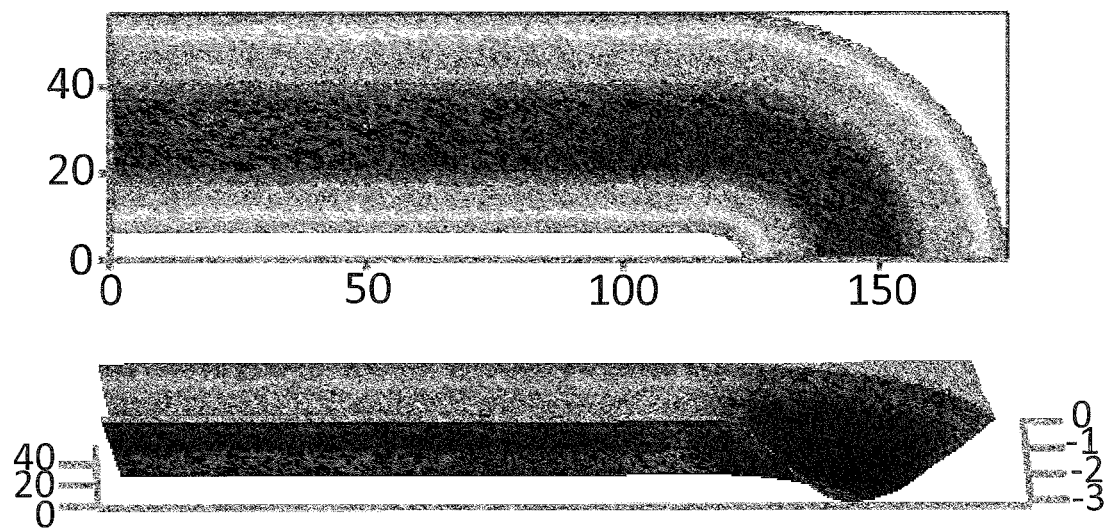
FIG. 9 shows a quarter of an erosion track profile formed on a sputtering target in a planar, rectangular magnetron sputtering device, the upper half of the Figure showing the profile as a contour plot and the lower half of the Figure showing the profile as a surface plot.

FIG. 9 shows one quarter of an example erosion track profile of a target (the full erosion track being substantially rectangular in shape). The upper half of the Figure shows a contour plot of the erosion track profile, the lower half shows a surface plot. Units are in millimetres. Such measured profile data can be used to generate a two-dimensional data array of the relative sputtering yield on the target surface, referred to as the trackyield, which is indicative of the target erosion speed. For example, the trackyield is proportional to the depth of the erosion track profile which can be measured directly.

The angular distribution of atoms ejected from the target must also be taken into account. The emission angle distribution is itself a function of the angle of incidence of sputter flux (i.e. the flux of ions used to sputter material from the target). The inventors have found that for polycrystalline material targets (such as titanium), the sputter yield tends to increase with increased angular deviation from the normal direction until a maximum is reached, and then decreases again as the angle of incidence approaches glancing incidence. For crystalline materials, such as silicon, the behaviour is more complicated and different minima and maxima are observed in the sputter yield as a function of angle of incidence, depending on the particular crystalline structure of the target. Minima are typically observed where ion bombardment occurs parallel to close-packed crystal structure directions because, in such orientations, ions may be directed along open crystal channels with fewer collision events dramatic enough to eject atoms or molecules from the target surface.

When microwave plasma pulsed DC magnetron sputtering is used, ion bombardment typically occurs approximately normal angle to the target surface (indeed, by considering particle collisions and a turbulent electric field, a mean incident angle of 7.95° to the target surface normal has previously been calculated using Monte Carlo simulations of sputtering). Accordingly, the variation of bombardment ion incident angles can be taken to be negligible for microwave plasma pulsed DC magnetron sputtering simulations and only the general function of the angular distribution of ejected particles is needed for simulations of magnetron sputtering.

For a crystalline target, the angular distribution of sputtered particles is related to crystal structure of the target and has previously been determined experimentally for, for example, a (100) Ag crystalline target bombarded by 100 eV Hg ions as set out by P. Sigmund in *Fundamental processes in sputtering of atoms and molecules* (*SPUT92*): *symposium on the occasion of the 250th anniversary of the Royal Danish Academy of Sciences and Letters*, Copenhagen, 30 Aug.-4 Sep. 1992: invited reviews. 43, (Kongelige Danske videnskabernes selskab, 1993). A similar distribution can be assumed for sputtering from a crystalline Si target.

The angular distribution of sputtered particles from polycrystalline targets has also previously been determined experimentally. According to the experimental results, polycrystalline targets can be divided into two groups dependent on their maximum emission angles measured relative to the target surface normal: a first group of targets in which the maximum emission angle is 0° (i.e. parallel to the surface normal); and a second group of targets in which the maximum emission angle occurs at 30° to the surface normal. For the first group, the angular distribution of sputtered particles, $f(\beta)$, varies according to $f(\beta)=A \cos^n \beta$. For the second group, $f(\beta)=A \cos^n \beta - B \cos^m \beta$. In general, the inventors have found that the angular distribution of sputtered particles from a polycrystalline target can be approximated as:

$$f(\beta)=\cos(\beta+\beta_0)^n$$

where $\beta_0$ is the angle of maximum emission and n is an adjustable parameter. In practice, both $\beta_0$ and n can be fit to an experimentally determined thickness distribution for a given target with a known mask shape.

Each point on the sputter target can be considered as a point source of sputtered particles. Accordingly, the number of particles arriving on the substrate surface is proportional to $$\frac{1}{r^2},$$

where r is the distance between a point $(X_t, Y_t, Z_t)$ on the target and a point $(X_s, Y_s, Z_s)$ on the substrate. A factor of $\cos \gamma$ must also be introduced to take into account the projection effect, where $\gamma$ is the angle between the deposition beam and the substrate surface normal.

A function describing the shape of the mask can be used to carry out a geometrical analysis to determine whether sputtered particles can reach the substrate surface or whether they will be blocked by the mask. This result is called the passrate and takes the values 1 (i.e. particles reach the substrate) or 0 (i.e. particles are blocked by the mask).

Accordingly, the probability that a particle sputtered from the point $(X_t, Y_t, Z_t)$ on the target will successfully travel to the point $(X_s, Y_s, Z_s)$ the substrate is given by:

$$P = \frac{\cos(\beta+\beta_0)^n \cdot trackyield \cdot passrate \cdot \cos \gamma}{r^2}$$

In order to carry out a calculation of P across the target, the target is divided into a fine mesh to allocate each point on the target a set of coordinates of $(X_t, Y_t, Z_t)$. At any one particular point on the substrate, $(X_s, Y_s, Z_s)$, the relative thickness of the coating deposited can be obtained from the sum of the probabilities of all target mesh elements.

Because the film thickness is uniform around the circumference of the rotating drum, it should only be necessary to calculate the film thickness along the centre line of the drum plate which is parallel to the axis about which the drum rotates, in order to optimize the mask design. However, because the drum is rotating, each on the centre line of the plate is moving around the circumference of the drum during deposition. As shown in FIG. 2, it is possible to construct a new set of substrate coordinates for the point $X_s$ at the centre line adjusted for rotation through an angle $\theta$. The corrected coordinates of each point on the centre line are $(X_s, Y_{s0}-R$ $\sin \theta, Z_{s0}-R \cos \theta)$, where $(X_s, Y_{s0}, Z_{s0})$ are the coordinates on the rotating drum axis. The relative thickness at each said point can be obtained by integrating with respect to $\theta$ between $-\theta_0$ and $\theta_0$. The thickness $T(X_s)$ is then given by $$T(X_s) = \sum_\theta \sum_{X_t Y_t Z_t} \frac{\cos(\beta+\beta_0)^n \cdot trackyield \cdot passrate \cdot \cos \gamma}{r^2}$$

This equation, combined with a predefined mask shape function, allows the deposited layer thickness to be simulated numerically.

Figure 10:
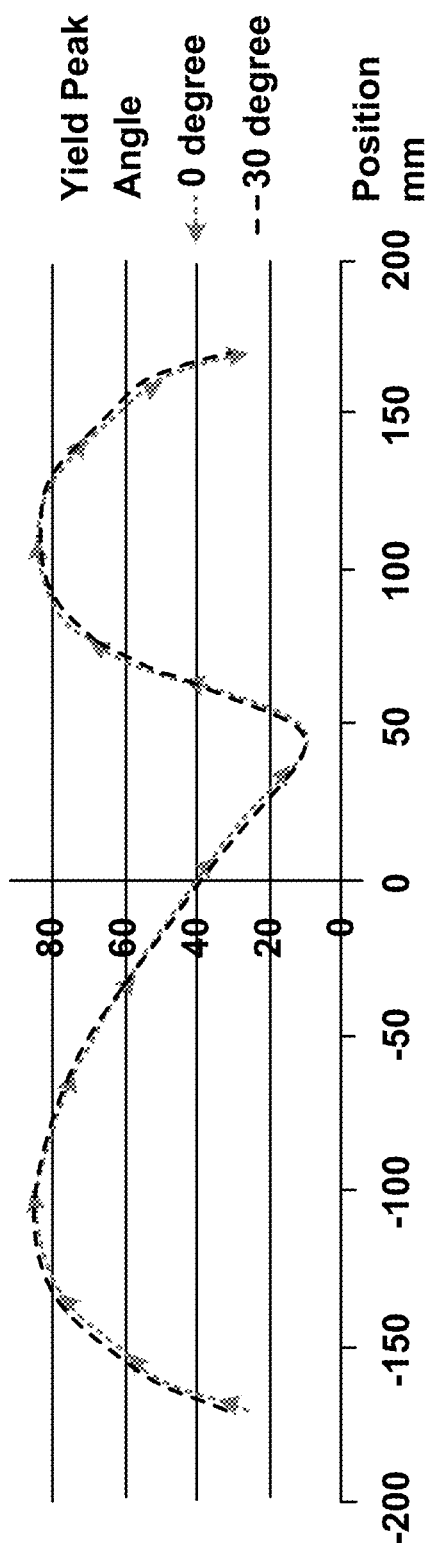
FIG. 10 shows the simulated thickness variation across the length of a deposited thin-film for a particular sputtering mask configuration taking into account two possible yield peak angles.
Figure 11:
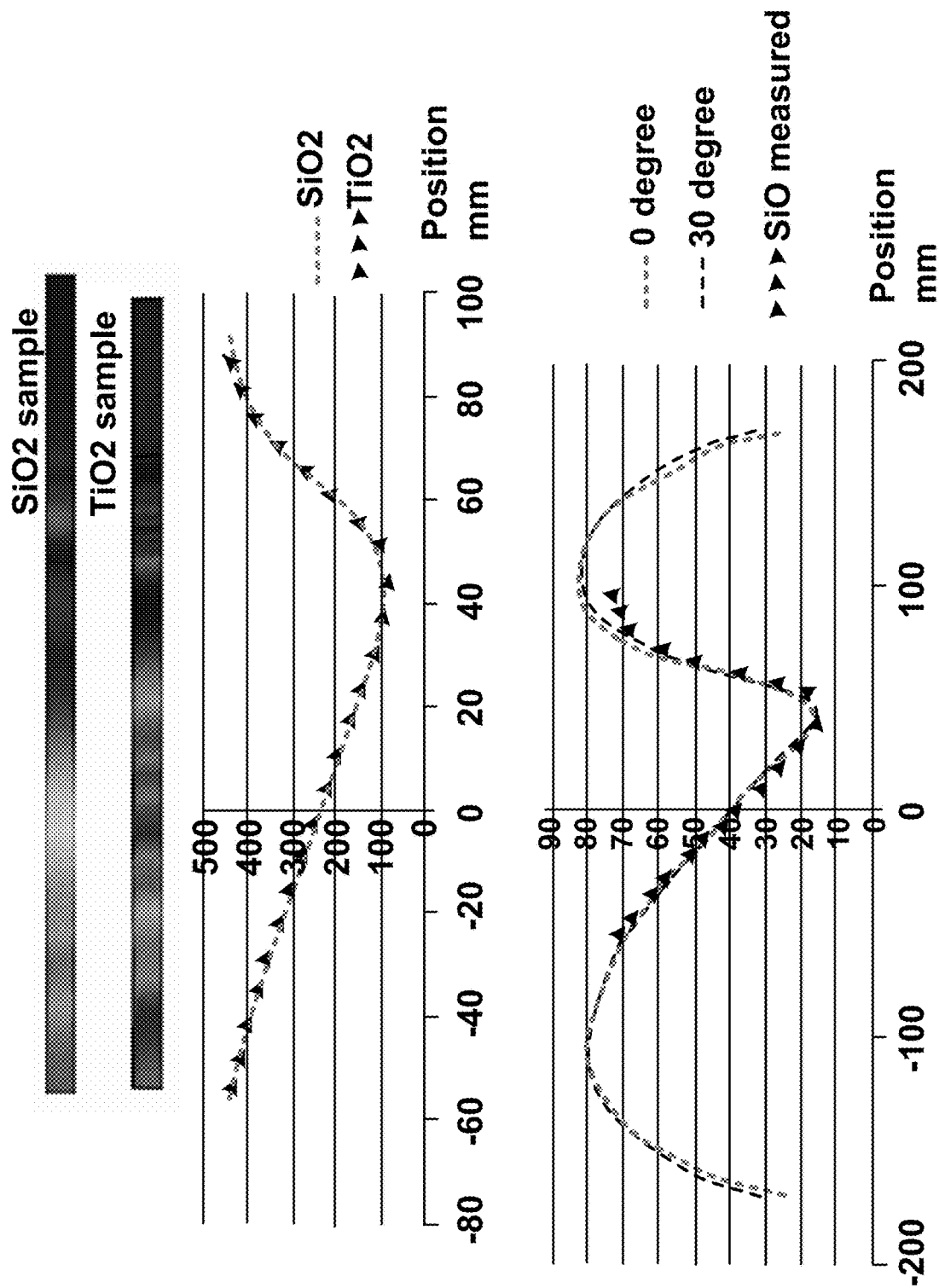
FIG. 11 compares experimental ellipsometry measurements of the thickness variation along the length of a thin-film deposited using a sputtering mask (having the same configuration as that used in the simulations of FIG. 10) with the results shown in FIG. 10.

FIG. 10 shows the simulated thickness distribution for a particular mask shape which results in the deposition of two regions varying linearly in thickness (between approximately −100 mm and 50 mm, and between approximately 50 mm and 100 mm, in position). The simulation was carried out using MathCAD software. FIG. 11 shows experimentally determined thickness measurements (using ellipsometry) from a real sample deposited using a mask having the same shape as that used in the simulations which generated the data shown in FIG. 10. The thickness simulation is shown to be highly accurate.

The effect of changing the mask shape on the deposited layer thickness distribution can be studied using this model. Accordingly, the mask shape can be optimised (e.g. numerically) in order to achieve a desired thickness variation.

Figure 12:
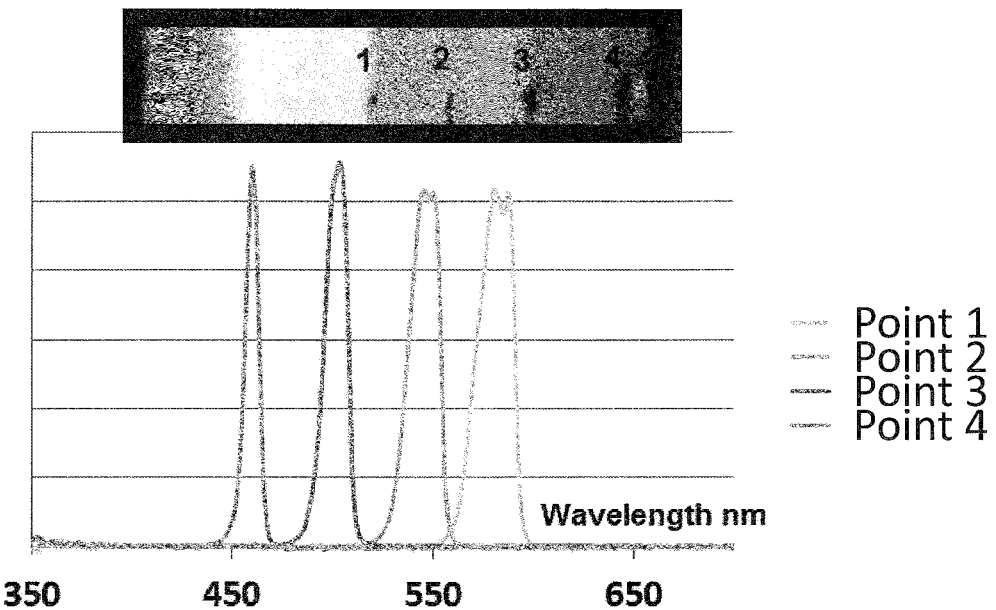
FIG. 12 shows the measured absorption spectra at four different locations along the length of an optical linear variable interference filter deposited using the apparatus of FIG. 1.

The inventors have used this method to design a sputter mask for the deposition of a linear variable filter, where the layer thickness varies linearly along one dimension. FIG. 12 shows the superimposed experimental absorption spectra of a linear variable filter (deposited using the mask developed through this method) measured at four different locations along the length of the filter. Four distinct passbands are observed, having widths of approximately 30 nm at 700 nm wavelengths and 5 nm at 400 nm wavelengths. The peak position gradient is roughly 7 nm/mm, and the length of linear variable filter required to cover the entire visible spectrum is approximately 40 mm.

Figure 13:
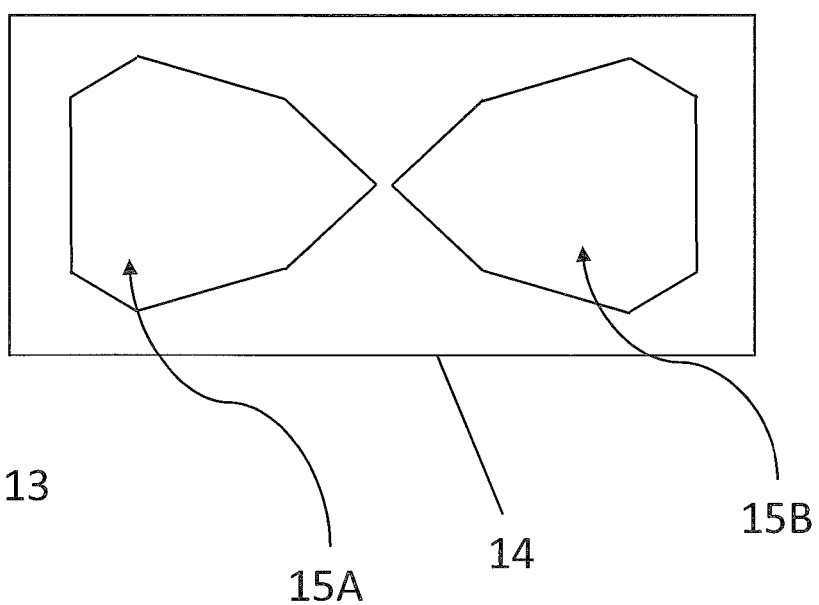
FIG. 13 shows schematically a static sputtering mask used in the deposition of the optical linear variable interference filter of FIG. 12.

The sputtering mask 14, as shown in FIG. 13, used to deposit the linear variable filter has two substantially tapered apertures 15A and 15B through which two regions of linearly varying thickness may be deposited in use. A single mask may therefore be used to deposit two regions of linearly varying thickness on a single substrate.

Figure 14:
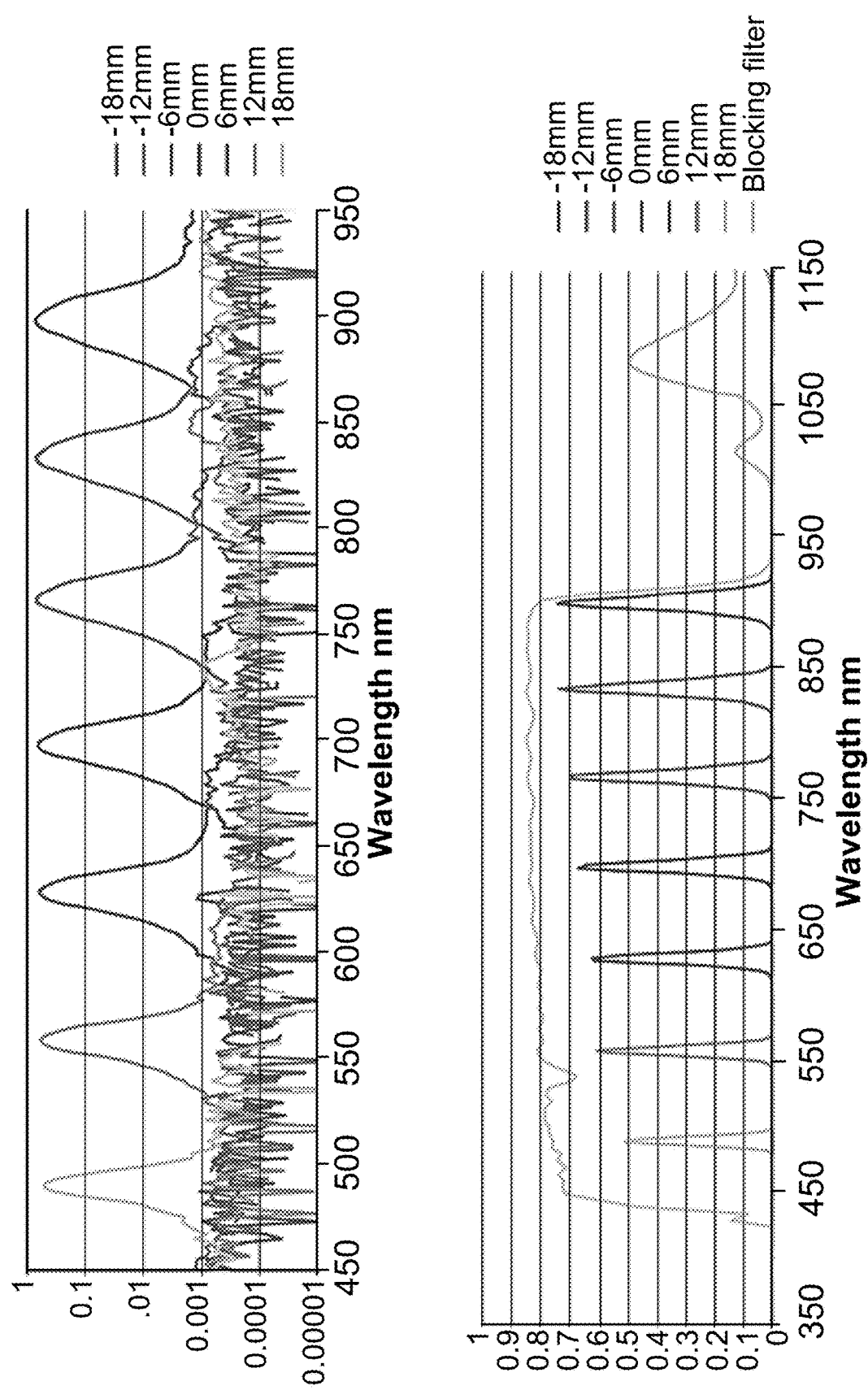
FIG. 14 shows the measured transmission spectra at seven different locations along the length of a second optical linear variable interference filter deposited using the apparatus of FIG. 1.

FIG. 14 shows the superimposed experimental transmission spectra for an alternative linear variable filter deposited using a similar mask. Transmission was measured at seven different locations along the length of the filter. Seven distinct passbands are observed within the wavelength range of 450 nm to 900 nm. The bandwidth of each transmission band is 1.5% of the specified wavelength. The percentage of light transmitted at each particular wavelength peak is greater than 50%, although this varies with peak position.

Figure 15:
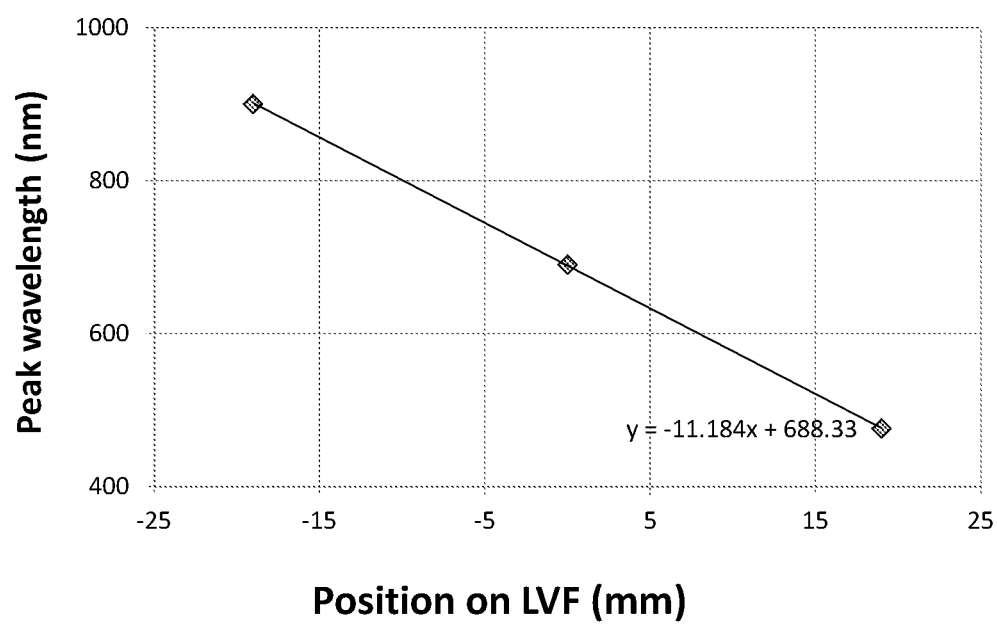
FIG. 15 shows the linear variation in transmission wavelength peak height for the linear variable interference filter of FIG. 14.

FIG. 15 shows the measured spatial variation of the peak transmission wavelengths along the length of the filter. The variation is linear with a gradient of approximately 11.3 nm/mm.

Further variations and modifications may be made within the scope of the invention herein disclosed.

The invention claimed is:

1. An apparatus for depositing one or more variable interference filters onto one or more substrates, the apparatus comprising a vacuum chamber, at least one magnetron sputtering device and at least one movable mount for supporting the one or more substrates within the vacuum chamber, the at least one magnetron sputtering device being configured to sputter material from a sputtering target towards the mount, thereby defining a sputtering zone within the vacuum chamber, wherein at least one static sputtering mask is located between the sputtering target and the mount, the at least one static sputtering mask being configured such that, when each substrate is moved through the sputtering zone on the at least one movable mount, a layer of material having a non-uniform thickness is deposited on each said substrate, wherein the at least one static sputtering mask is configured to deposit one or more variable interference filters onto one or more substrates and is configured to take into account the angular distribution of the sputtered material, wherein the apparatus comprises at least one plasma processing device configured to direct plasma-generated gas ions towards the mount, thereby defining a plasma treatment zone within the vacuum chamber, and wherein the at least one movable mount is a drum and the apparatus further comprises at least one deposition sensor and one or more apertures provided in the drum, such that when the drum rotates, the material sputtered by the at least one magnetron sputtering device reaches and is deposited onto the at least one deposition sensor when said one or more apertures are provided directly between the at least one deposition sensor and the at least one magnetron sputtering device and that the material sputtered by the at least one magnetron sputtering device is prevented from being deposited onto the at least one deposition sensor when said one or more apertures are rotated out of alignment with the at least one magnetron sputtering device.

2. The apparatus according to claim 1, wherein the at least one static sputtering mask is configured such that the layer of material deposited on each substrate varies in thickness along a first direction and is substantially uniform in thickness along a second direction substantially perpendicular to the first direction, and wherein the at least one static sputtering mask is configured such that the layer of material deposited on each substrate varies linearly in thickness along the first direction.

3. The apparatus according claim 1, wherein the at least one static sputtering mask comprises one or more apertures configured such that the layer of material deposited on each substrate has a non-uniform thickness, and wherein the one or more apertures are elongated and tapered.

4. The apparatus according to claim 1, wherein the at least one magnetron sputtering device is a direct current (DC) magnetron sputtering device configured to generate a rectangular sputtering plasma adjacent to the sputtering target.

5. The apparatus according to claim 1, comprising two or more magnetron sputtering devices, each said magnetron sputtering device being configured to sputter material from a corresponding sputtering target towards the mount, thereby defining one or more respective sputtering zones within the vacuum chamber, wherein a corresponding static sputtering mask is provided between each sputtering target and the mount, each said static sputtering mask being configured such that, when each substrate is moved through each sputtering zone on the at least one movable mount, a respective layer of material having a non-uniform thickness is deposited on said substrate.

6. The apparatus according to claim 1, wherein the plasma processing device is a microwave plasma processing device, configured to direct oxygen ions towards the mount.

7. The apparatus according to claim 1, comprising at least first and second magnetron sputtering devices, the first magnetron sputtering device being configured to sputter metal towards the mount from a first sputtering target comprising metal, thereby defining a metal sputtering zone within the vacuum chamber, the second magnetron sputtering device being configured to sputter non-metal or metalloid towards the mount from a second sputtering target comprising non-metal or metalloid, thereby defining a non-metal or metalloid sputtering zone within the vacuum chamber, wherein a first static sputtering mask is located between the first sputtering target and the mount, the first sputtering mask being configured such that when each substrate is moved through the metal sputtering zone on the mount, a layer of metal material having a non-uniform thickness is deposited on said substrate, and a second static sputtering mask is located between the second sputtering target and the mount, the second sputtering mask being configured such that when each substrate is moved through the non-metal or metalloid sputtering zone on the mount, a layer of non-metal or metalloid material having a non-uniform thickness is deposited on said substrate, and wherein the first and second magnetron sputtering devices, the mount, the first and the second sputtering masks are configured to repeat the deposition such that alternating layers of metal and non-metal or metalloid materials are formed on the one or more substrates, and each of the alternating layers is of non-uniform thickness, and wherein the first and the second sputtering masks are configured to deposit one or more variable interference filters onto one or more substrates and are configured to take into account respectively the angular distribution of the sputtered metal and the angular distribution of the sputtered non-metal or metalloid.

8. The apparatus according to claim 1, wherein the static sputtering mask is configured such that the layer of material deposited on each substrate varies in thickness along a first direction in two or more regions and such that the layer of material is uniform in thickness along the first direction in one or more regions between the said two or more regions.

9. The apparatus according to claim 1, wherein the static sputtering mask is configured to further take into account the sputtering yield distribution across the sputtering target surface, mask shielding and the layer growth process on the at least one movable mount.

10. The apparatus according to claim 1, wherein the at least one static sputtering mask is configured to direct a non-uniform wavefront of the sputtered material towards the at least one mount.

11. The apparatus according to claim 1, wherein the at least one movable mount is a drum which takes a shape of a convex polygonal prism, and the drum is rotatable about an axis parallel to a first direction in which the layer of material deposited on the one or more substrates varies in thickness.

12. A method of depositing one or more variable interference filters onto one or more substrates, the method comprising: at least one magnetron sputtering device sputtering material from a sputtering target to thereby define a sputtering zone within a vacuum chamber; at least one mount moving the one or more substrates through the sputtering zone, wherein the mount is a drum comprising one or more apertures; providing at least one deposition sensor and rotating the drum such that the material sputtered by the at least one magnetron sputtering device reaches and is deposited onto the at least one deposition sensor when said one or more apertures are provided directly between the at least one deposition sensor and the at least one magnetron sputtering device and that the material sputtered by the at least one magnetron sputtering device is prevented from being deposited onto the at least one deposition sensor when said one or more apertures are rotated out of alignment with the at least one magnetron sputtering device; and providing at least one static sputtering mask between the sputtering target and the mount, the at least one static sputtering mask being configured to take into account the angular distribution of the sputtered material such that a variable interference filter comprising a layer of material having a non-uniform thickness is deposited on each substrate moved through the sputtering zone, and the method further comprising at least one plasma processing device directing gas ions generated by a plasma towards the mount, thereby defining a plasma treatment zone within the vacuum chamber.

13. The method according to claim 12, wherein the at least one static sputtering mask is configured such that the layer of material deposited on each substrate varies in thickness along a first direction and is substantially uniform in thickness along a second direction substantially perpendicular to the first direction, wherein the at least one static sputtering mask is configured such that the layer of material deposited on each substrate varies linearly in thickness along the first direction.

14. The method according to claim 12, wherein the at least one static sputtering mask comprises one or more apertures configured such that the layer of material deposited on each substrate has a non-uniform thickness, and wherein the one or more apertures are elongate and tapered.

15. The method according to claim 12, wherein the at least one magnetron sputtering device is a direct current (DC) magnetron sputtering device configured to generate a rectangular sputtering plasma adjacent to the sputtering target, and wherein the at least one plasma process device is a microwave plasma processing device configured to direct oxygen ions towards the mount, to thereby form a layer of metal oxide on each substrate moved through the plasma treatment zone.

16. The method according to claim 12, wherein two or more magnetron sputtering devices sputtering material from corresponding sputter targets towards the mount, thereby defining two or more respective sputtering zones within the vacuum chamber; the at least one mount moving the one or more substrates through each said sputtering zone; and providing at least one corresponding static sputtering mask between each sputtering target and the mount, each said static sputtering mask being configured such that a layer of material having a non-uniform thickness is deposited on each substrate moved through each sputtering zone.

17. The method according to claim 12, comprising at least first magnetron sputtering device sputtering metal from a first sputtering target comprising metal, thereby defining a metal sputtering zone within the vacuum chamber, the second magnetron sputtering device sputtering non-metal or metalloid from a second sputtering target comprising non-metal or metalloid, thereby defining a non-metal or metalloid sputtering zone within the vacuum chamber, the at least one mount moving the one or more substrates through each said sputtering zone, providing a first static sputtering mask located between the first sputtering target and the mount, the first sputtering mask being configured to take into account the angular distribution of the sputtered metal such that a layer of metal material having a non-uniform thickness is deposited on each substrate moved through the metal sputtering zone, providing a second static sputtering mask located between the second sputtering target and the mount, the second sputtering mask being configured to take into account the angular distribution of the sputtered non-metal or metalloid such that a layer of non-metal or metalloid material having a non-uniform thickness is deposited on each substrate moved through the non-metal or metalloid sputtering zone, and wherein the deposition is repeated to deposit one or more variable interference filters onto one or more substrates such that each filter comprises alternating layers of metal and non-metal or metalloid materials, and each of the alternating layers is of non-uniform thickness.

18. The method according to claim 17, comprising depositing two variable interference filters on opposing faces of the substrate wherein the thicknesses of the filters vary in opposite orientations along the same axis.

19. The method according to claim 12, comprising configuring the shape of the at least one sputtering mask by a model simulation which takes into account the angular distribution of the sputtered material, the sputtering yield distribution across the sputtering target surface, mask shielding and the film growth process on the at least one movable mount.

20. A method of depositing one or more variable interference filters onto one or more substrates, the method comprising: at least one magnetron sputtering device sputtering material from a sputtering target to thereby define a sputtering zone within a vacuum chamber; at least one mount moving the one or more substrates through the sputtering zone; providing at least one static sputtering mask between the sputtering target and the mount, the at least one static sputtering mask being configured to take into account the angular distribution of the sputtered material such that a variable interference filter comprising a layer of material having a non-uniform thickness is deposited on each substrate moved through the sputtering zone; and depositing two variable interference filters on opposing faces of the substrate wherein the thicknesses of the filters vary in opposite orientations along the same axis, and the method further comprising at least one plasma processing device directing gas ions generated by a plasma towards the mount, thereby defining a plasma treatment zone within the vacuum chamber.

* * * * *